United States Patent
Maejima et al.

(10) Patent No.: US 8,542,533 B2
(45) Date of Patent: Sep. 24, 2013

(54) NON-VOLATILE SEMICONDUCTOR MEMORY DEVICE

(75) Inventors: Hiroshi Maejima, Tokyo (JP); Natsuki Sakaguchi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 13/424,724

(22) Filed: Mar. 20, 2012

(65) Prior Publication Data

US 2012/0320678 A1 Dec. 20, 2012

(30) Foreign Application Priority Data

Jun. 14, 2011 (JP) .................................. 2011-131776

(51) Int. Cl.
*G11C 16/04* (2006.01)
*G11C 16/06* (2006.01)

(52) U.S. Cl.
USPC ............. 365/185.18; 365/185.17; 365/185.23

(58) Field of Classification Search
USPC ..................................... 365/185.18
See application file for complete search history.

(56) References Cited

U.S. PATENT DOCUMENTS

| | | | |
|---|---|---|---|
| 7,558,117 B2 * | 7/2009 | Maejima et al. | 365/185.18 |
| 7,701,771 B2 * | 4/2010 | Jeong et al. | 365/185.18 |
| 7,839,686 B2 | 11/2010 | Shibata | |
| 7,852,676 B2 | 12/2010 | Maejima | |
| 7,903,469 B2 * | 3/2011 | Iwai et al. | 365/185.25 |
| 2005/0232012 A1 | 10/2005 | Park | |

* cited by examiner

*Primary Examiner* — Son Mai
(74) *Attorney, Agent, or Firm* — Oblon, Spivak, McClelland, Maier & Neustadt, L.L.P.

(57) ABSTRACT

In performing a read operation of a memory transistor, a control circuit supplies a first voltage to a selected word line connected to a selected memory transistor. A second voltage is supplied to a non-selected word line connected to a non-selected memory transistor other than the selected memory transistor, the second voltage being higher than the first voltage. A third voltage is supplied to a bit line. A fourth voltage lower than the third voltage is supplied to, among source lines, a selected source line connected to a memory string including the selected memory transistor in a selected memory block. A fifth voltage substantially the same as the third voltage is supplied to, among the source lines, a non-selected source line connected to a non-selected memory string in the selected memory block.

20 Claims, 18 Drawing Sheets

SELECTED MEMORY STRING MSs IN SELECTED MEMORY BLOCK MBs

NON-SELECTED MEMORY STRING MSns IN SELECTED MEMORY BLOCK MBs

NON-SELECTED MEMORY STRING MSns IN NON-SELECTED MEMORY BLOCK MBns

SELECTED MEMORY STRING MSs IN SELECTED MEMORY BLOCK MBs

NON-SELECTED MEMORY STRING MSns IN NON-SELECTED MEMORY BLOCK MBns

SELECTED MEMORY STRING MSs IN SELECTED MEMORY BLOCK MBs

NON-SELECTED MEMORY STRING MSns IN SELECTED MEMORY BLOCK MBs

NON-SELECTED MEMORY STRING MSns IN NON-SELECTED MEMORY BLOCK MBns

NON-VOLATILE SEMICONDUCTOR
MEMORY DEVICE

CROSS REFERENCE TO RELATED
APPLICATIONS

This application is based on and claims the benefit of priority from prior Japanese Patent Application No. 2011-131776, filed on Jun. 14, 2011, the entire contents of which are incorporated herein by reference.

FIELD

The embodiments described herein relate to a non-volatile semiconductor memory device.

BACKGROUND

For the purpose of more highly integrated memory devices, a stacked non-volatile semiconductor memory device has recently been proposed that includes three-dimensionally disposed memory cells.

DETAILED DESCRIPTION

Figure 1:
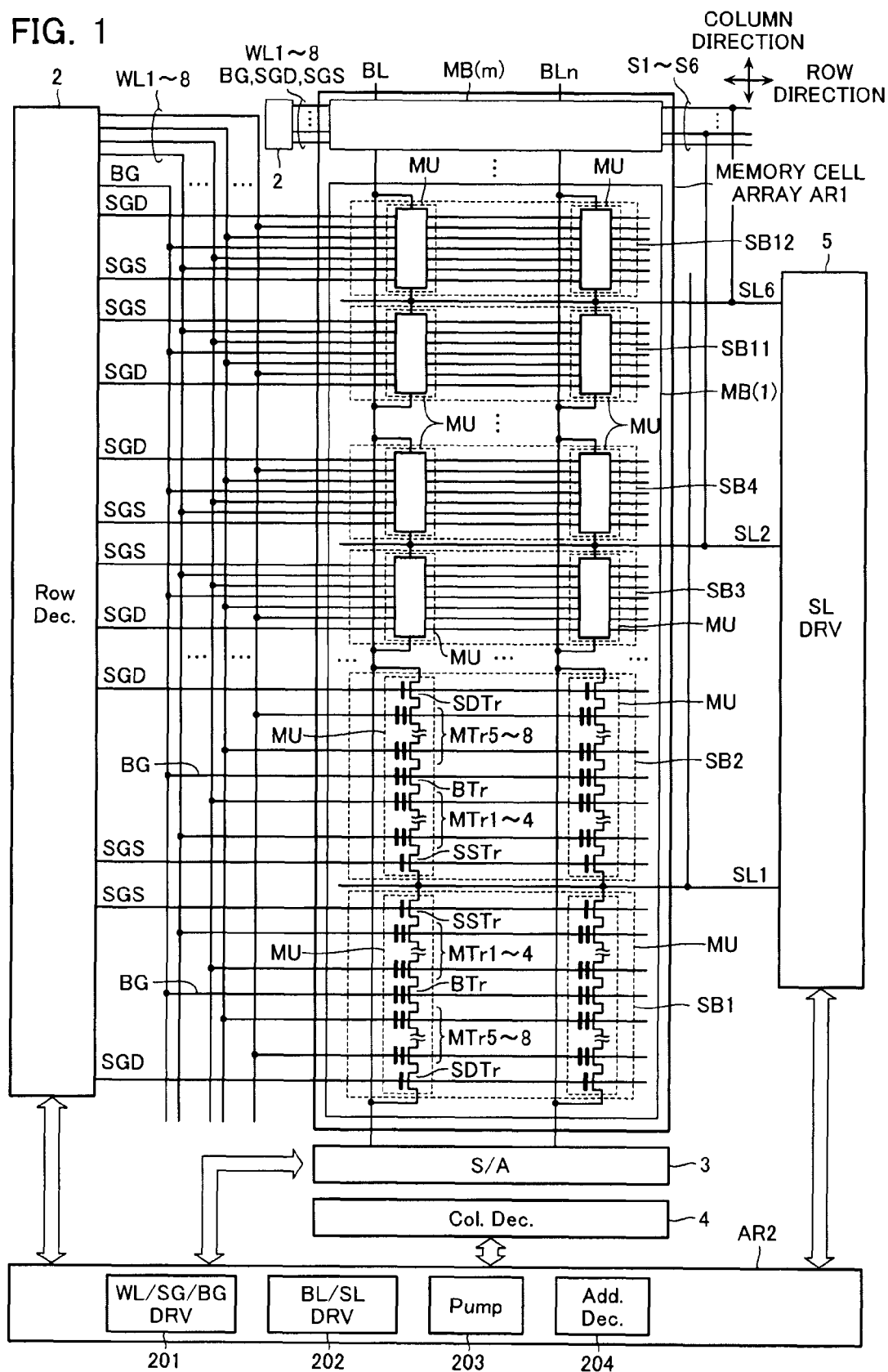
FIG. 1 is a circuit diagram of the entire configuration of a non-volatile semiconductor memory device according to a first embodiment.

A non-volatile semiconductor memory device according to the embodiments described below includes a memory cell array, the memory cell array including a plurality of memory blocks. Each of the memory blocks includes a plurality of memory strings formed therein. Each of the memory strings includes a plurality of memory transistors connected in series. A drain-side select transistor is provided having first end connected to a first end portion of the memory string. A source-side select transistor is provided having first end connected to a second end portion of the memory string.

A plurality of word lines are provided with each of the word lines being commonly connected to the memory strings disposed in each memory block. The bit line is connected to second ends of the drain-side select transistors in respective memory blocks. A plurality of source lines are provided in each of the memory blocks, each of the source lines being connected to a second end of the source-side select transistor. A drain-side select gate line is provided to commonly connect gates of the drain-side select transistors. A source-side select gate line is provided to commonly connect gates of the source-side select transistors.

In performing a read operation of the memory transistor, a control circuit supplies voltages as follows. A first voltage is supplied to a selected word line connected to a selected memory transistor. A second voltage is supplied to a non-selected word line connected to a non-selected memory transistor other than the selected memory transistor, the second voltage being higher than the first voltage. A third voltage is supplied to the bit line. A fourth voltage lower than the third voltage is supplied to, among the source lines, a selected source line connected to a memory string including the selected memory transistor in a selected memory block. A fifth voltage substantially the same as the third voltage is supplied to, among the source lines, a non-selected source line connected to a non-selected memory string in the selected memory block.

Referring to the drawings, the embodiments of a non-volatile semiconductor memory device according to the present invention will be described below.

It will be understood that when an element is referred to as being "electrically connected to" or "connected to" another element, it can be not only directly connected but also connected to the other element or intervening elements may be present.

[First Embodiment]

First, referring to FIG. 1, the entire configuration of a non-volatile semiconductor memory device according to the first embodiment will be described. FIG. 1 is a circuit diagram of the non-volatile semiconductor memory device according to the first embodiment.

With reference to FIG. 1, the non-volatile semiconductor memory device according to the first embodiment includes a memory cell array AR1 and components around the memory cell array AR1, including a row decoder 2, a sense amplifier circuit 3, a column decoder 4, a source line driver 5, and a control circuit AR2.

The memory cell array AR1 includes memory cells arranged three-dimensionally, as described below. With reference to FIG. 1, the memory cell array AR1 includes memory strings MS arranged in a matrix. Each memory string MS includes electrically rewritable memory transistors (memory cells) MTr1 to MTr8 and a back gate transistor BTr connected in series.

The row decoder 2 is disposed adjacent to the memory cell array AR1. The row decoder 2 drives, according to an address signal from the control circuit AR2, a word line WL, select-gate-lines SGD and SGS, and a back gate line BG. The column decoder 4 selects, according to the address signal supplied from the control circuit AR2, an address for write and read. The sense amplifier circuit 3 determines, in the read operation, data stored in the memory cells. Further, the sense amplifier circuit 3 drives, according to the address signal supplied from the control circuit AR2 via the column decoder 4, a bit line BL.

The control circuit AR2 has a function of controlling the voltages applied to components including the memory cells MTr. The control circuit AR2 includes: a driver 201 for driving the word line WL, the select-gate-lines SGD and SGS, and the back gate line BG; a driver 202 for driving the bit line BL and the source line SL; a charge pump circuit 203 for boosting the power supply voltage to a certain boost voltage; and an address decoder 204.

The control circuit AR2 performs the operation of writing data in the memory cells MTr, the erase operation of erasing data in the memory cells MTr, and the operation of reading data from the memory cells MTr.

With reference to FIG. 1, the memory cell array AR1 includes m columns of memory blocks MB (MB (1) to MB (m)). Each of the memory blocks MB includes memory units MU arranged in a matrix of n rows and 12 columns, for example. Each of the memory units MU includes a memory string MS, a source-side select transistor SSTr connected to the source-side of the memory string MS, and a drain-side select transistor SDTr connected to the drain-side of the memory string MS, and a back gate transistor BTr.

Note that in the example shown in FIG. 1, n memory units MU arranged in the first row in one memory block MB are described as a sub-block SB1 and n memory units MU arranged in the twelfth row are described as a sub-block SB12. Although FIG. 1 describes an example where one memory block MB includes 12 sub-blocks SB1 to SB12 therein, it should be appreciated that the present invention is not limited thereto, needless to say.

The m memory blocks MB (1) to MB (m) share the same bit lines BL. Specifically, the bit lines BL extend in the column direction (the first direction) shown in FIG. 1, and are connected to the memory units MU (at the drain-side select transistors SDTr) aligned in the column direction in the m memory blocks MB (1) to MB (m). In each of the memory blocks MB, 12 memory units MU arranged in the column direction are commonly connected to the same bit line BL.

Figure 2:
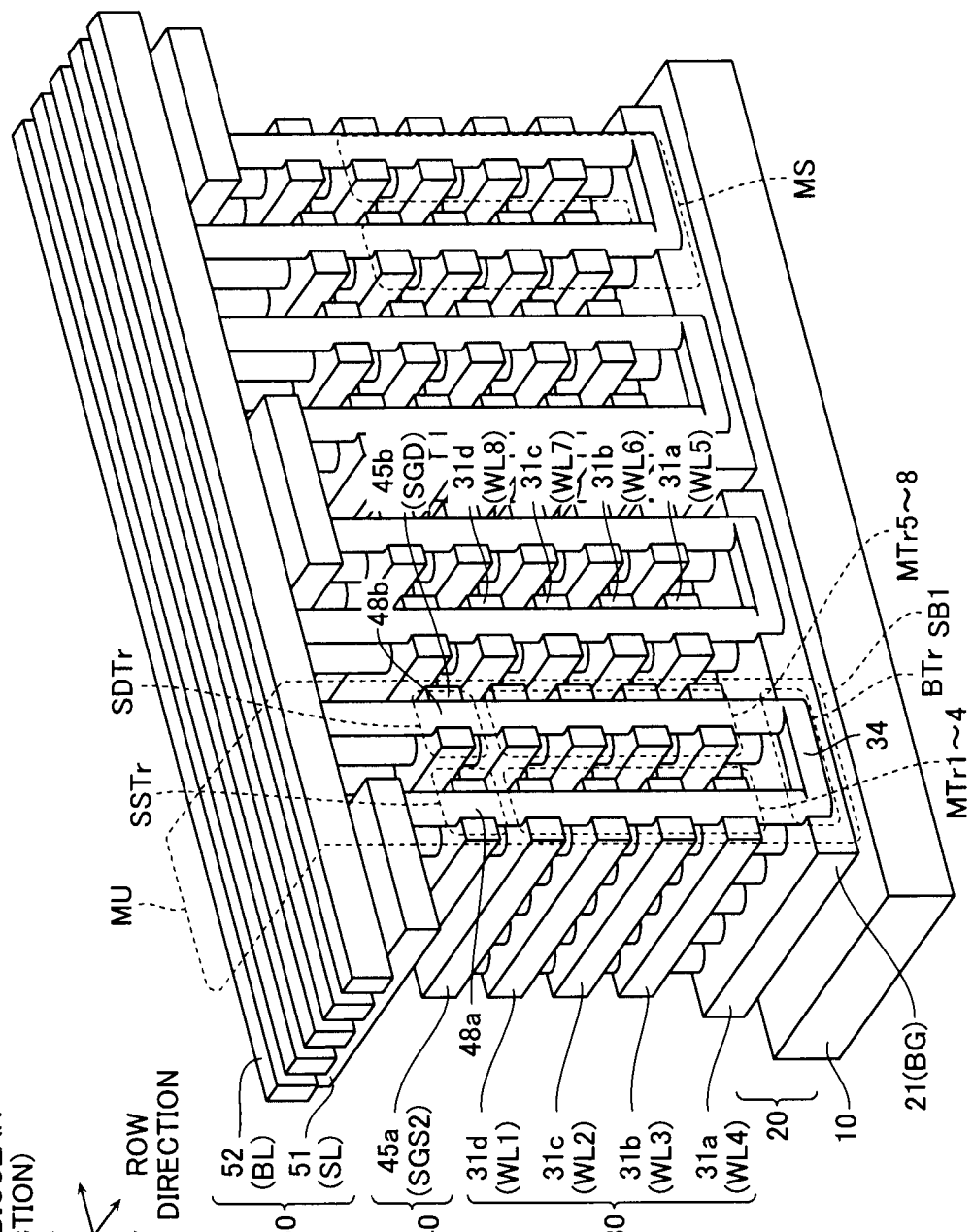
FIG. 2 is a schematic perspective view of the memory cell array AR1 in FIG. 1.

Further, in each of the memory blocks MB, the n×12 memory units MU share the word line WL1 to word line WL8 and the back gate line BG shown in FIG. 2. In addition, the n memory units MU arranged in the row direction share the select-gate-line SGD and the select-gate-line SGS. Specifically, the memory units MU commonly connected to one drain-side select gate line SGD and one source-side select gate line SGS form one sub-block SB (SB1 to SB12).

With reference to FIG. 2, in the memory cell array AR1, the memory cells MTr are arranged in a three-dimensional matrix. Specifically, the memory cells MTr are arranged in a matrix in the horizontal direction, and are also arranged in the stacking direction (the direction perpendicular to the substrate). The memory cells MTr1 to MTr4 arranged in the stacking direction are connected in series. The memory cells MTr5 to MTr8 arranged in the stacking direction are also connected in series. The memory cells MTr1 to MTr4 and MTr5 to MTr8 are included in the above memory string MS. The memory strings MS are formed, in each of the memory blocks MB (1) to MB (m), extending in the direction perpendicular to the substrate 10. Each memory string MS includes the memory transistors MTr connected in series.

The drain-side of the memory string MS is connected to the drain-side select transistor SDTr. The source-side of the memory string MS is connected to the source-side select transistor SSTr. The drain-side select transistor SDTr and the source-side select transistor SSTr are provided to determine the selection/non-selection of each of the memory strings MS. The memory strings MS are arranged in the stacking direction as the longitudinal direction.

Figure 3:
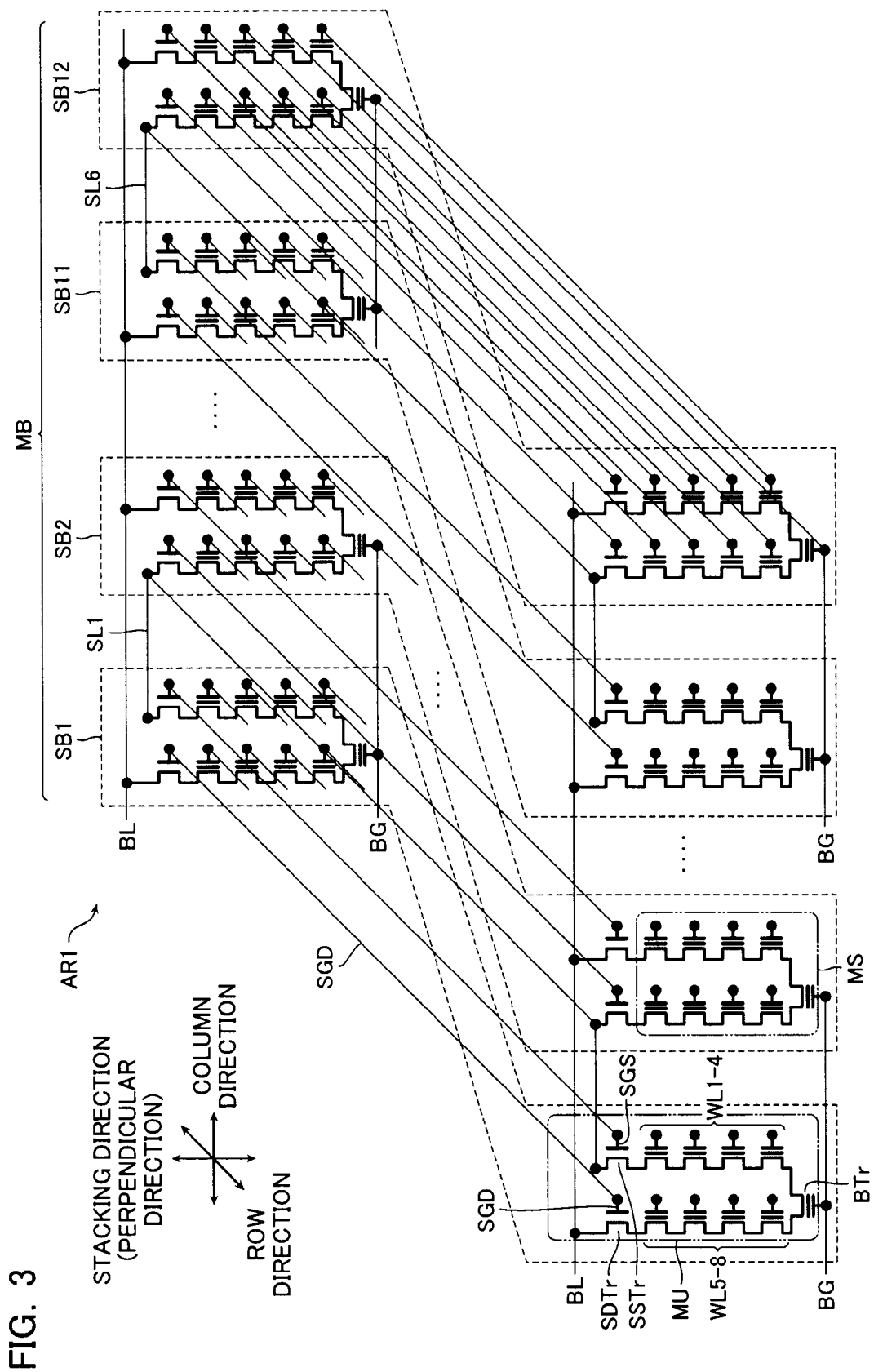
FIG. 3 is an equivalent circuit diagram of the circuitry of the memory cell array AR1 in FIG. 1.

Referring now to FIG. 3, the circuitry of one memory block MB included in the memory cell array AR1 will be specifically described. The bit lines BL are arranged at a certain pitch in the row direction and extend in the column direction as the longitudinal direction.

The memory blocks MB each include a plurality of (n×12) memory units MU arranged in a matrix in the row direction and column direction. Each of the memory units MU includes the memory string MS, the source-side select transistor SSTr, and the drain-side select transistor SDTr. The memory units MU are arranged in a matrix in the row direction and column direction in the memory block MB.

Each of the memory strings MS includes the memory cells MTr1 to MTr8 and the back gate transistor BTr. The threshold voltages of the memory cells MTr1 to MTr8 depend on the amount of charge accumulated in the charge accumulation layers. The change of the charge amount results in the change of data held in the memory cells MTr1 to MTr8.

The back gate transistor BTr is connected between the memory cell MTr4 and the memory cell MTr5 in the bottom layer. Therefore, the memory cells MTr1 to MTr8 and the back gate transistor BTr are connected in a U shape in a cross-section along the column direction.

The gates of the n rows of memory cells MTr1 in one memory block MB are commonly connected to one word line WL1 extending in the row direction. Similarly, the gates of the n rows of memory cells MTr2 to MTr8 are commonly connected to the corresponding one of the word lines WL2 to WL8 extending in the row direction. The word lines WL1 to WL8 are formed in a comb teeth shape as described below. Each of n×12 memory cells MTr in a memory block is thus commonly connected to one of the word lines WL1 to WL8 in the corresponding sub-block SB. The n rows of memory units MU form the sub-block SB. This configuration is repeated 12 times in the column direction, thus forming the 12 sub-blocks SB. The gates of the n×12 back gate transistors BTr are each commonly connected to one of the back gate line BG in the corresponding sub-blocks SB.

The gates of the n source-side select transistors SSTr aligned in the row direction are commonly connected to one of the source-side select gate lines SGS extending in the row direction. Further, the sources of the source-side select transistors SSTr are connected to one of the source lines SL extending in the row direction. A plurality of (for example, 6) source lines SL are provided in one memory block MB. In other words, in one memory block MB, more than one (for example, 6) source lines SL1 to SL6 are divided from each other and provided possible to independently control the voltages.

In this embodiment, two sub-blocks SB adjacent in the column direction share one source line SL. FIG. 1 shows an example where among 12 sub-blocks SB1 to SB12 in one memory block MB (i), two adjacent sub-blocks SB share one source line SL (for example, the sub-blocks SB1 and SB2 share one source line SL1). Additionally, one source line SL may be provided for one sub-block SB (one source line SL may be provided for one of the 12 sub-blocks of SB1 to SB12 in one memory block MB (i) 1, thus providing a total of 12 source lines SL).

Although this embodiment shows an example where a plurality of memory blocks MB (1) to MB (m) share the source lines SL1 to SL6, each memory block MB may have independent source lines SL (6 source lines SL in the example in FIG. 1) (i.e., m memory blocks MB may have a total of m×6 source lines SL).

The source lines SL1 to SL6 may be independently voltage-controlled by the source line driver 5. Note, however, that one source line SLk (k=1 to 6) is wired and shared by the memory blocks MB (i). Further, each source line SLk is shared between the sub-blocks SB adjacent in the column direction. The source line driver 5 performs a control of providing different voltages to the source lines SL1 to SL6 included in one memory block MB (i) depending on whether or not the source line SL is connected to the selected memory string.

The gates of the n drain-side select transistors SDTr aligned in the row direction are commonly connected to one drain-side select gate line SGD extending in the row direction. The drains of the drain-side select transistors SDTr are connected to the bit lines BL extending in the column direction.

Figure 4:
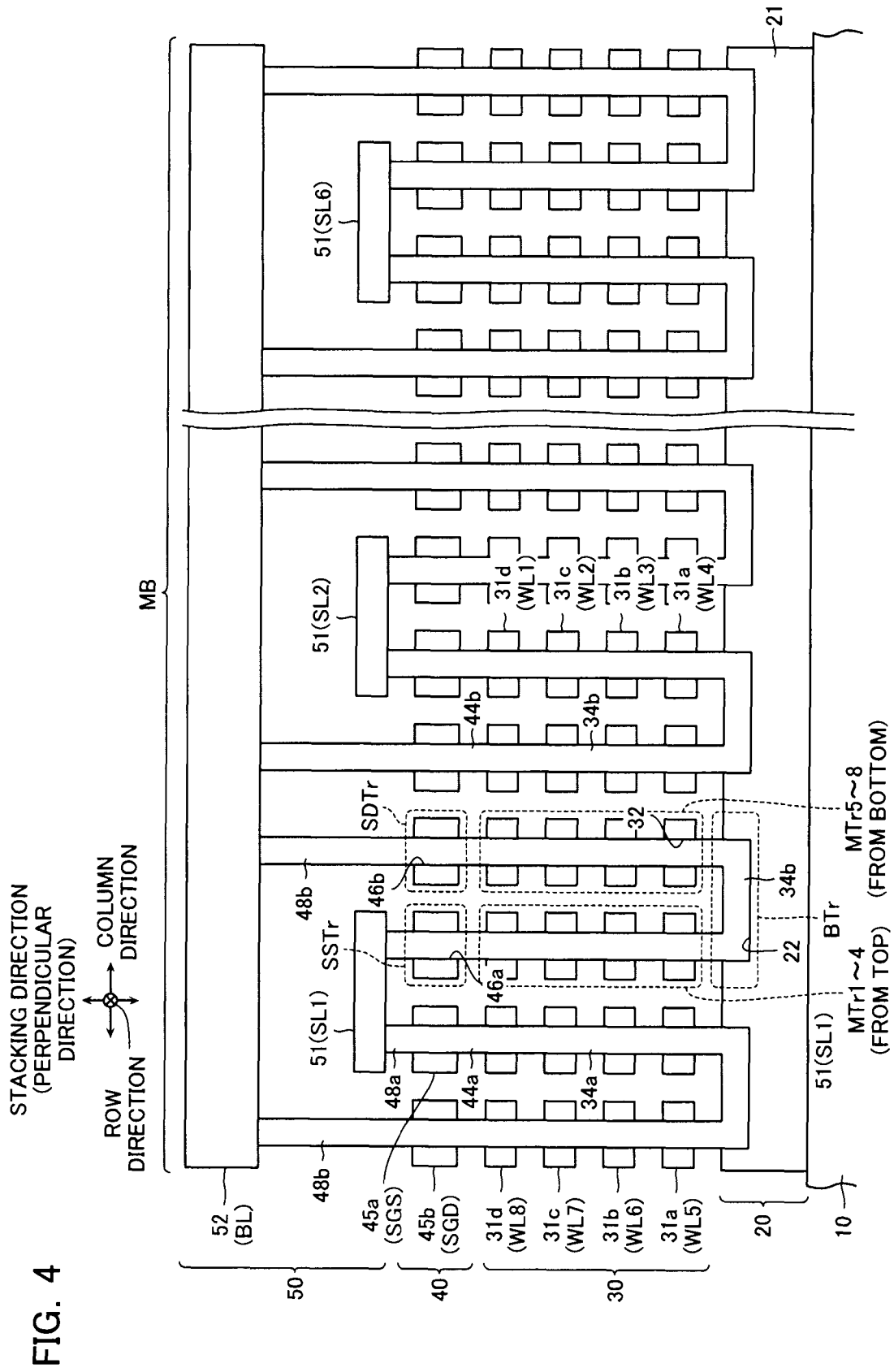
FIG. 4 is a schematic cross-sectional view of the memory block MB in the memory cell array AR1 in FIG. 1.
Figure 5:
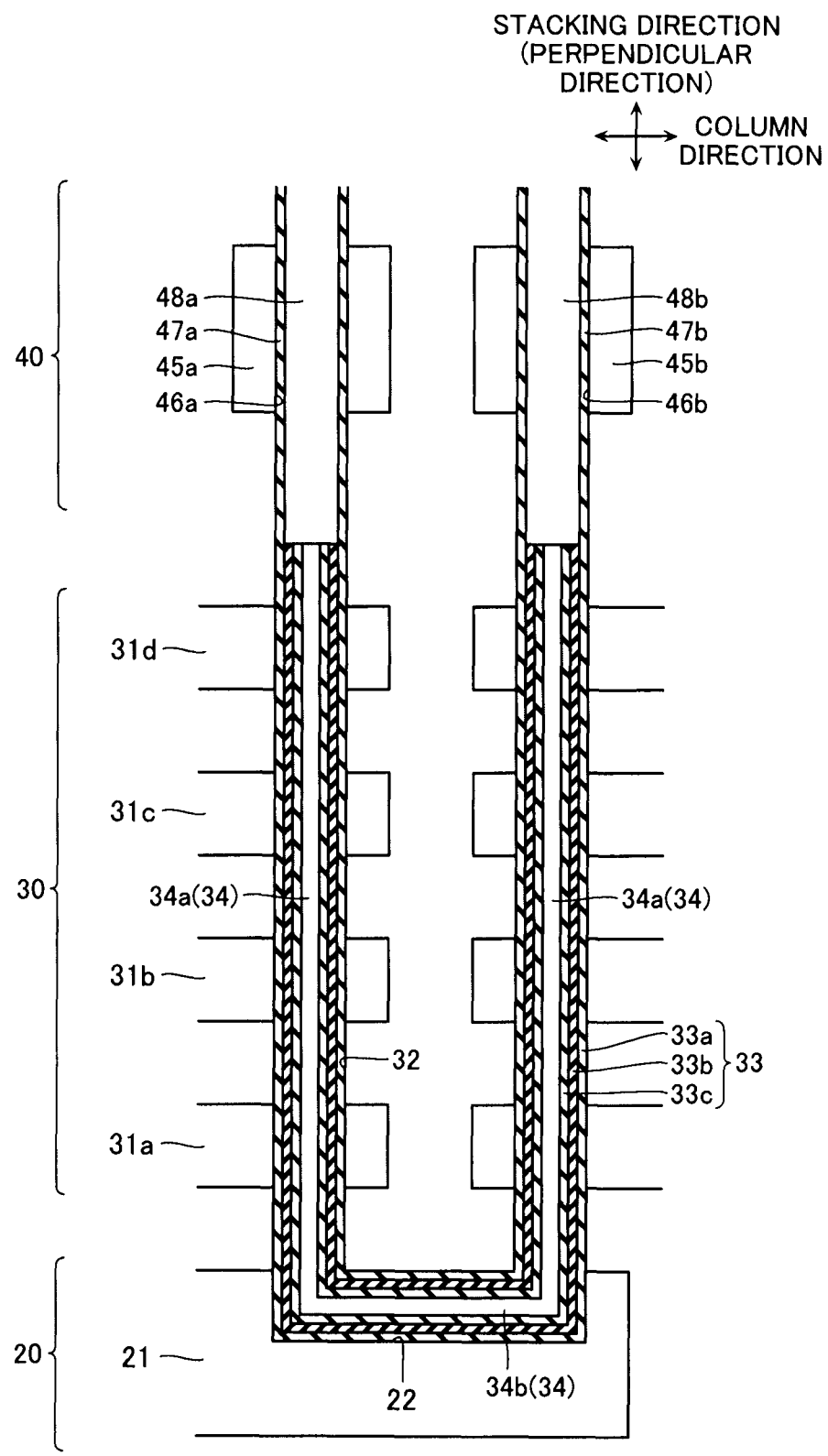
FIG. 5 is a schematic cross-sectional view of a memory unit MU in one memory block MB.
Figure 6:
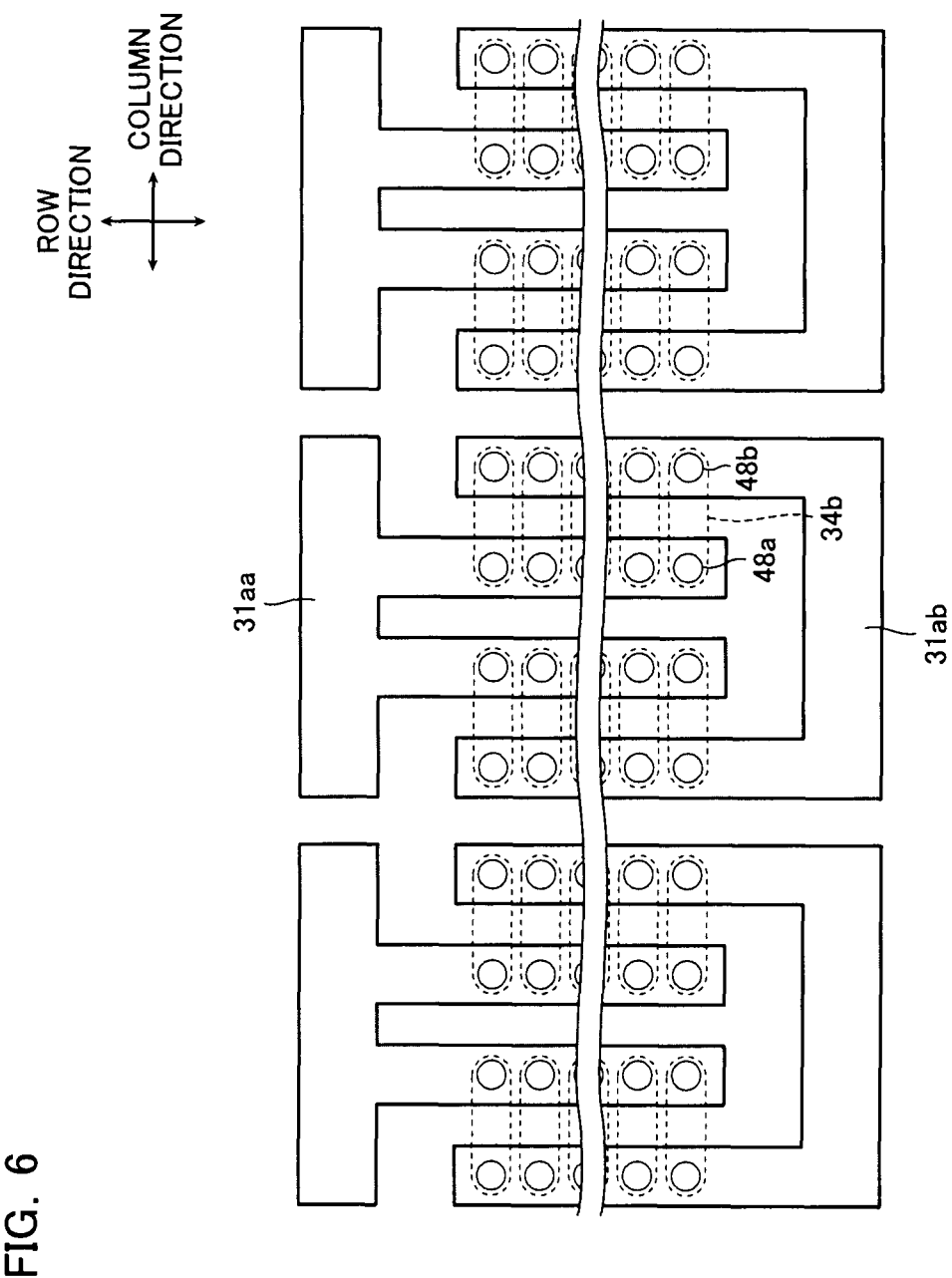
FIG. 6 is a plan view of one memory block MB.

Referring now to FIG. 4, FIG. 5, and FIG. 6, the stacked structure of the non-volatile semiconductor memory device according to the first embodiment will be described.

With reference to FIG. 4, the memory cell array AR1 includes, on the substrate 10, a back gate transistor layer 20, a memory cell layer 30, a select transistor layer 40, and a wiring layer 50.

The back gate transistor layer 20 functions as the back gate transistors BTr. The memory cell layer 30 functions as the memory cells MTr1 to MTr8 (the memory string MS). The select transistor layer 40 functions as the source-side select transistors SSTr and the drain-side select transistors SDTr. The wiring layer 50 functions as the source lines SL and the bit lines BL.

The back gate transistor layer 20 includes a back gate conductive layer 21. The back gate conductive layer 21 functions as the back gate lines BG, and also as the gates of the back gate transistors BTr. The back gate conductive layer 21 is formed extending two-dimensionally in the row direction and column direction parallel with the substrate 10. The back gate conductive layer 21 is divided into each memory block MB. The back gate conductive layer 21 is made of polysilicon (poly-Si), for example.

With reference to FIG. 4, the back gate transistor layer 20 includes a back gate semiconductor layer 34b (a coupling portion 34b). The back gate semiconductor layer 34b is embedded in a back gate hole 22. The back gate hole 22 is formed trimming the back gate conductive layer 21. The back gate hole 22 is formed in a generally rectangular shape having a longitudinal direction in the column direction when viewed in top plan view. The back gate hole 22 is formed in a matrix in the row direction and column direction.

The memory cell layer 30 is formed above the back gate transistor layer 20. The memory cell layer 30 includes word line conductive layers 31a to 31d. The word line conductive layers 31a to 31d function as the word lines WL1 to WL8, and also as the gates of the memory cells MTr1 to MTr8.

The word line conductive layers 31a to 31d are stacked via interlayer insulating layers (not shown). The word line conductive layers 31a to 31d are formed extending, at a certain pitch in the column direction, in the row direction as the longitudinal direction. The word line conductive layers 31a to 31d are made of polysilicon (poly-Si).

The memory cell layer 30 includes a memory semiconductor layer 34. The memory semiconductor layer 34 is embedded in a memory hole 32. The memory hole 32 is formed passing through the word line conductive layers 31a to 31d and a not-shown interlayer insulating layer. The memory hole 32 is formed fitting the vicinity of the end portion of the back gate hole 22 in the column direction.

Further, with reference to FIG. 4 and FIG. 5, the back gate transistor layer 20 and the memory cell layer 30 include a memory gate insulating layer 33 and the memory semiconductor layer 34. The memory semiconductor layer 34 functions as the bodies of the memory cells MTr1 to MTr8 (the memory string MS).

With reference to FIG. 5, the memory gate insulating layer 33 is formed with a certain thickness on the side surfaces of the back gate hole 22 and the memory hole 32. The memory gate insulating layer 33 includes a block insulating layer 33a, a charge accumulation layer 33b, and a tunnel insulating layer 33c.

With reference to FIG. 5, the block insulating layer 33a is formed with a certain thickness on the side surfaces of the back gate hole 22 and the memory hole 32. The charge accumulation layer 33b is formed with a certain thickness on the side surface of the block insulating layer 33a. The tunnel insulating layer 33c is formed with a certain thickness on the side surface of the charge accumulation layer 33b. The block insulating layer 33a and the tunnel insulating layer 33c are made of silicon dioxide (SiO2), for example. The charge accumulation layer 33b is made of silicon nitride (SiN), for example.

The memory semiconductor layer 34 is formed in contact with the side surface of the tunnel insulating layer 33c. The memory semiconductor layer 34 is formed filling the back gate hole 22 and the memory hole 33. The memory semiconductor layer 34 is formed in a U shape when viewed in the row direction. The memory semiconductor layer 34 includes a pair of columnar portions 34a extending in the direction perpendicular to the substrate 10 and the coupling portion 34b coupling the lower ends of the pair of columnar portions 34a. The memory semiconductor layer 34 is made of polysilicon (poly-Si).

In other words, the above back gate transistor layer 20 has a configuration in which the memory gate insulating layer surrounds the coupling portion 34b. The back gate conductive layer 21 surrounds the coupling portion 34b via the memory gate insulating layer 33. Further, in other words, the above memory cell layer 30 has a configuration in which the memory gate insulating layer 33 surrounds the columnar portion 34a. The word line conductive layers 31a to 31d surround the columnar portion 34a via the memory gate insulating layer 33.

With reference to FIG. 5, the select transistor layer includes a source-side conductive layer 45a and a drain-side conductive layer 45b. The source-side conductive layer 45a functions as the source-side select gate lines SGS and also as the gates of the source-side select transistors SSTr. The drain-side conductive layer 45b functions as the drain-side select gate lines SGD and also as the gates of the drain-side select transistors SDTr.

The source-side conductive layer 45a is formed around the semiconductor layer 48a. The drain-side conductive layer 45b is in the same layer as the source-side conductive layer 45a and is similarly formed around the semiconductor layer 48b. The source-side conductive layer 45a and the drain-side conductive layer 45b are made of polysilicon (poly-Si), for example.

With reference to FIG. 4, the select transistor layer 40 includes a source-side hole 46a and a drain-side hole 46b. The source-side hole 46a is formed passing through the source-side conductive layer 45a. The drain-side hole 46b is formed passing through the drain-side conductive layer 45b. The source-side hole 46a and the drain-side hole 46b are formed at the respective positions matching the memory hole 32.

With reference to FIG. 5, the select transistor layer includes a source-side gate insulating layer 47a, a source-side columnar semiconductor layer 48a, a drain-side gate insulating layer 47b, and a drain-side columnar semiconductor layer 48b. The source-side columnar semiconductor layer 48a functions as the body of the source-side select transistor SSTr. The drain-side columnar semiconductor layer 48b functions as the bodies of the drain-side select transistors SDTr.

With reference to FIG. 4, the wiring layer 50 is formed above the select transistor layer 40. The wiring layer 50 includes a source line layer 51 and a bit line layer 52. The source line layer 51 functions as the source lines SL. The bit line layer 52 functions as the bit lines BL.

The source line layer 51 is formed in a generally plate shape extending in the row direction. The source line layer 51 is formed in contact with the top surface of the pair of source-side columnar semiconductor layers 48a adjacent in the column direction. The bit line layer 52 is in contact with the top surface of the drain-side columnar semiconductor layer 48b. The bit line layer 52 is formed in a stripe pattern extending in the column direction at a certain pitch in the row direction. The source line layer 51 and the bit line layer 52 are made of metals such as tungsten (W), copper (Cu), and aluminum (Al).

Referring now to FIG. 6, the shapes of the word line conductive layers 31a to 31d will be described in more detail. FIG. 6 is a top view of the shapes of the word lines 31a to 31d. FIG. 6 shows, by way of example, a plane shape of the word line conductive layer 31a in the bottom layer. The shapes of the other word line conductive layers 31a to 31d are generally the same as the conductive layer 31a, and the repeated description thereof is omitted here.

With reference to FIG. 6, the word line conductive layer 31a includes a pair of conductive layers 31aa and 31ab formed in a comb teeth shape. The pair of conductive layers 31aa and 31ab are opposed in a manner allowing their comb teeth portions to engage each other. The layers 31aa and 31ab are divided into each memory block MB. The conductive layer 31aa functions as the word line WL5, for example. The conductive layer 31ab functions as the word line WL4, for example.

Referring now to FIGS. 7A to 7D, the read operation of the non-volatile semiconductor memory device according to the first embodiment will be described.

In performing the read operation, an externally supplied block address is first used to select one memory block MB as a selected memory block MBs. Then, the memory string MS included in one sub-block SB in the selected memory block MBs is selected as the selected memory string MSs.

Figure 7A:
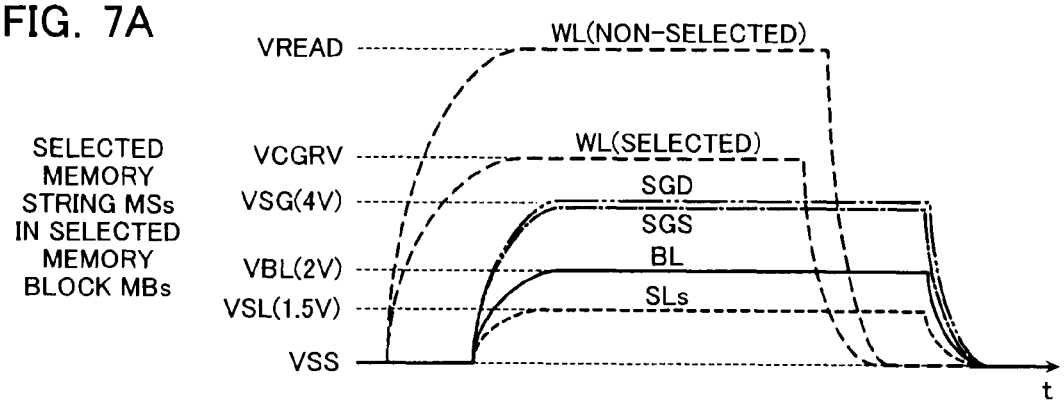
FIG. 7A is a waveform chart of the read operation in a non-volatile semiconductor memory device according to the first embodiment.
Figure 7B:
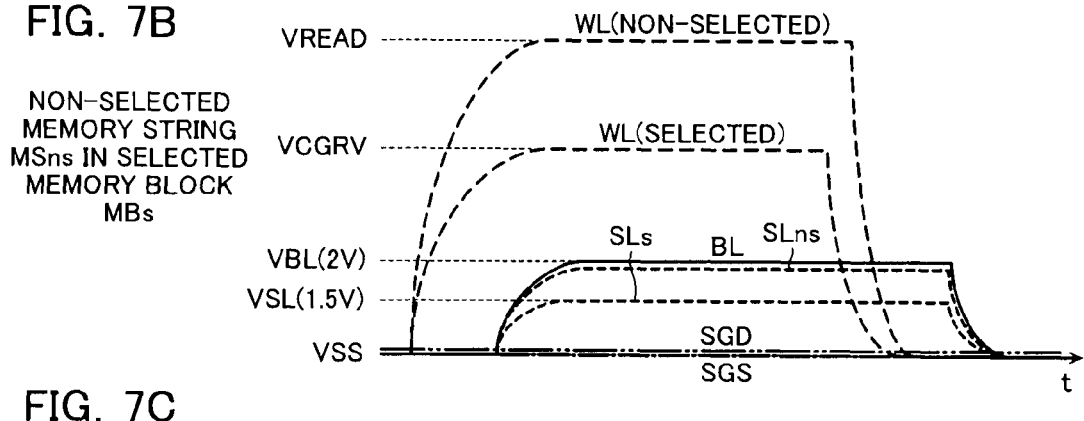
FIG. 7B is a waveform chart of the read operation in a non-volatile semiconductor memory device according to the first embodiment.
Figure 7C:
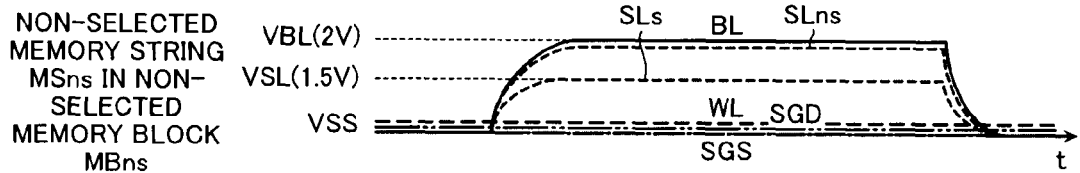
FIG. 7C is a waveform chart of the read operation in a non-volatile semiconductor memory device according to the first embodiment.

FIGS. 7A to 7C show the waveforms of the voltages supplied to the respective portions in the read operation. Referring first to FIG. 7A, the voltages supplied to the selected memory string MSs and the selected source line SLs in the selected memory block MBs will be described.

In the selected memory string MSs, the word line WL (the selected word lines WL) connected to the selected memory cell MTrs to be read is supplied with the voltage VCGRV. The non-selected word line WLns connected to the non-selected memory cell MTrns is supplied with the read-pass voltage VREAD. The voltage VCGRV is a voltage about between the upper limit and the lower limit of a plurality of threshold voltage distributions of the memory cell MTr (if one memory cell MTr stores multi-bit data, the voltage VCGRV may have more than one value). Further, the read-pass voltage VREAD is a voltage that may render the memory cell MTr conductive regardless of data held in the selected memory cell MTr. The read-pass voltage VREAD is about 6 V to 8 V, for example.

Further, the drain-side and source-side select gate lines SGD and SGS connected to the respective drain-side and source-side select gate transistors SDTr and SSTr connected to the selected memory string MSs are supplied with the voltage VSG (about 4 V). The voltage VSG is a voltage to render the drain-side select gate transistor SDTr and the source-side select transistor SSTr conductive.

Then, the bit line BL connected to the selected memory string MSs is supplied with a voltage VBL (about 2 V), and the source line SLs (the selected source line SLs) connected to the selected memory string MSs is supplied with a voltage VSL (about 1.5 V) lower than the voltage VBL.

The above voltage application allows the following read operation to be performed in the selected memory string MSs. Specifically, if the threshold voltage of the selected memory cell MTr is higher than the voltage VCGRV, the selected memory cell MTr is not rendered conductive. Therefore, the potential of the bit line BL is not decreased and is maintained at the voltage VBL. If the threshold voltage of the selected memory cell MTr is equal to or lower than the voltage VCGRV, the selected memory cell MTr is rendered conductive, thereby decreasing the potential of the bit line BL to the voltage VSL. The variation amount of the potential of the bit line BL may be detected by the sense amplifier circuit 3 to determine held data of the selected memory cell MTr.

Referring now to FIG. 7B, the voltages supplied to the non-selected memory string MSns and the non-selected source line SLns in the selected memory block MBs will be described.

The memory strings MS in the selected memory block MBs share one word line WL. With reference to FIG. 7B, therefore, the word line WL connected to the non-selected memory string MSns in the selected memory block MBs is supplied with the same voltages (VCGRV and VREAD) as those in the word line WL of the selected memory string MSs. The same holds true for the bit line BL. Further, the drain-side select gate line SGD and the source-side select gate line SGS are supplied with 0 V (the ground voltage VSS).

For the non-selected memory string MSns, however, the voltage of the source line SLns (the non-selected source line SLns) connected thereto is set to the same voltage (the voltage VBL) as the voltage supplied to the bit line BL. Because the drain-side select gate line SGD and the source-side select gate line SGS are maintained at 0 V, the drain-side select transistor SDTr and the source-side select transistor SSTr are maintained in the non-conductive state. If, however, the drain-side select transistor SDTr and the source-side select transistor SSTr each have a large leak current, the potential of the bit line BL may be reduced, which may reduce the read margin of the sense amplifier circuit 3, thereby causing the generation of the false reading.

In this regard, this embodiment provides the bit line BL and the non-selected source line SLns with the same potential (the voltage VBL). Accordingly, the leak current is reduced and the potential of the bit line BL is not decreased. Therefore, the read margin of the sense amplifier circuit may be increased, thereby reducing the probability that a false reading occurs.

Referring now to FIG. 7C, the voltages supplied to the non-selected memory string MSns and the non-selected source line SLns in the non-selected memory block MBns will be described.

With reference to FIG. 7C, in the non-selected memory block MBns, all word lines WL are provided with the ground potential VSS (0 V). Further, all drain-side select gate lines SGD and source-side select gate lines SGS are supplied with 0 V (the ground voltage VSS). The bit line BL is supplied with the voltage VBL. The non-selected source line SLns is supplied with the voltage VBL (and the selected word line SLs is supplied with the voltage VSL). Therefore, even in the non-selected memory block MBns, the leak current is reduced.

Figure 7D:
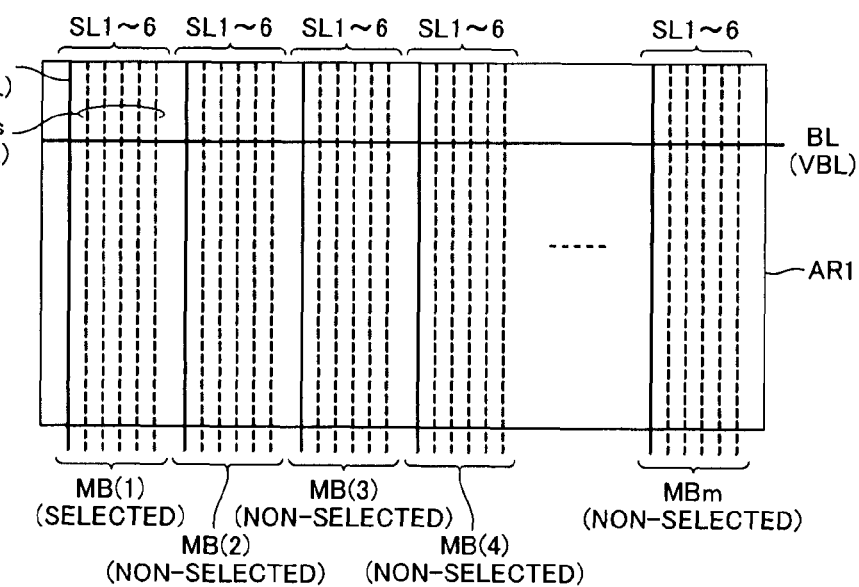
FIG. 7D is a schematic diagram of the read operation in a non-volatile semiconductor memory device according to the first embodiment.

As described above, in the non-volatile semiconductor memory device according to this embodiment as shown in FIG. 7D, the source line SLs connected to the selected memory string MSs in the selected memory block MB is supplied with the voltage VSL to perform the read operation, the voltage VSL being lower than the voltage VBL supplied to the bit line BL. The source line SLns connected to the non-selected memory string MSns in the selected memory block MB is provided with a voltage (here, VBL) generally the same as the voltage VBL supplied to the bit line BL (note, however, that, the non-selected memory string MSns that shares the source line SL with the selected memory string MSs is supplied with the voltage VSL from the source line SLs). Even in the non-selected memory blocks MB, a similar voltage is supplied to the source line SL. Thus, the leak current in the non-selected memory string MSns may be reduced, thereby increasing the read margin of the sense amplifier circuit. The voltage of the source line SL of the non-selected memory string MSns does not necessarily need to equal the voltage VBL of the bit line BL. Provided that the purpose of reducing the leak current is achieved, some difference is allowed between the bit line BL voltage and the source line SL voltage.

With reference to FIG. 7D, because the source line SL is commonly connected to the selected memory cell string MSs and the non-selected memory string MSns adjacent thereto, the source line SL connected to the non-selected memory string MSns may also be supplied with the voltage VSL. This will be described in more detail referring to FIG. 7B. Specifically, a description is given of the voltage supplied to a non-selected memory string MSns that is present in the selected memory block MBns and is connected to the selected source line SLs.

The non-selected memory string MSns that is present in the selected memory block MBns and is connected to the selected source line SLs is supplied with voltages (VCGRV and VREAD) at its word line WL. The voltages are the same as the voltages supplied to the word lines WL of the selected memory string MSs and other non-selected memory strings MSns.

Further, for the non-selected memory string MSns that is present in the selected memory block MBns and is connected to the selected source line SLs, the voltage supplied to the bit line BL is the same voltage as the selected memory string MSs.

Further, the non-selected memory string MSns that is present in the selected memory block MBns and is connected to the selected source line SLs is supplied with 0 V (the ground voltage VSS) at its drain-side select gate line SGD and source-side select gate line SGS. This is the same as in other non-selected memory strings MSns in the selected memory block MBs.

Note, however, that the non-selected memory string MSns that is present in the selected memory block MBns and is connected to the selected source line SLs is supplied with the voltage VSL from the source line SL.

However, the other source lines SL2 to SL6 in the selected memory block MBns are set to the non-selected source lines SLns, and are supplied with the voltage VBL. As a result, a lower leak current may be achieved than those in the conventional technologies. Further, sharing the source line SL in two or more sub-blocks SB may provide a simpler circuit operation and a larger storage capacity.

If the source line SL is prepared for each sub-block SB, it is necessary to control the voltages of the source lines SL independently for each sub-block SB, which complicates the circuit operation. A memory cell array of a small storage capacity does not complicate the circuit operation very much. A memory cell array of a large storage capacity, however, complicates the circuit operation, thereby increasing the device area for achieving the circuit operation. In this embodiment, therefore, a plurality of (for example, two) sub-blocks SB share the source line SL. This may achieve a lower leak current, a simpler circuit operation, and a larger storage capacity.

Figure 8:
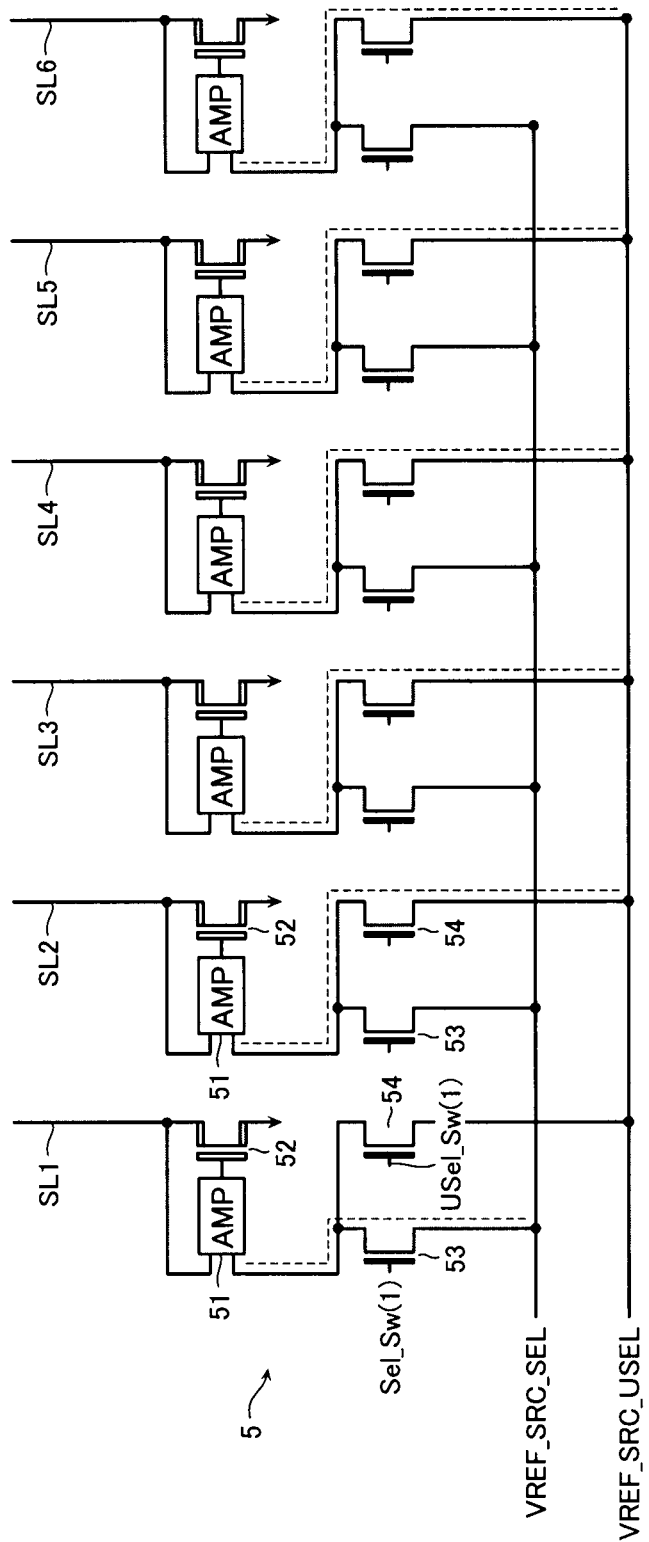
FIG. 8 is a circuit diagram of a specific example configuration of the source line driver 5 according to the first embodiment.

FIG. 8 shows a specific example configuration of the source line driver 5. The source line driver 5 includes, for each source line SL, a differential amplifier 51, a high breakdown voltage NMOS transistor 52, and NMOS transistors 53 and 54.

The differential amplifier 51 differentially amplifies the reference voltage VREF_SRC_SEL or VREF_SRC_USEL supplied from the NMOS transistor 53 or 54 and the voltage of the source line SL. The high breakdown voltage NMOS transistor 52 is supplied at its gate with the output signal from the differential amplifier 51. The drain and the source of the transistor 52 are connected to the source line SL and the ground terminal, respectively.

The NMOS transistors 53 and 54 are provided at their gates with the control signals Sel_Sw (i) and USel_Sw (i)(i=1 to 6), respectively, to alternatively bring one of them to the conductive state and the other to the non-conductive state. For the source line SL connected to the selected memory string MSs, the NMOS transistor 53 is rendered conductive, thereby supplying the differential amplifier 51 with the reference voltage VREF_SRC_SEL. In this case, the NMOS transistor 54 is maintained in the non-conductive state.

If the source line SL is a source line connected to the non-selected memory string MSns, the NMOS transistor 54 is rendered conductive, thereby supplying the differential amplifier 51 with the reference voltage VREF_SRC_USEL. In this case, the NMOS transistor 53 is maintained in the non-conductive state.

[Second Embodiment]

Figure 9:
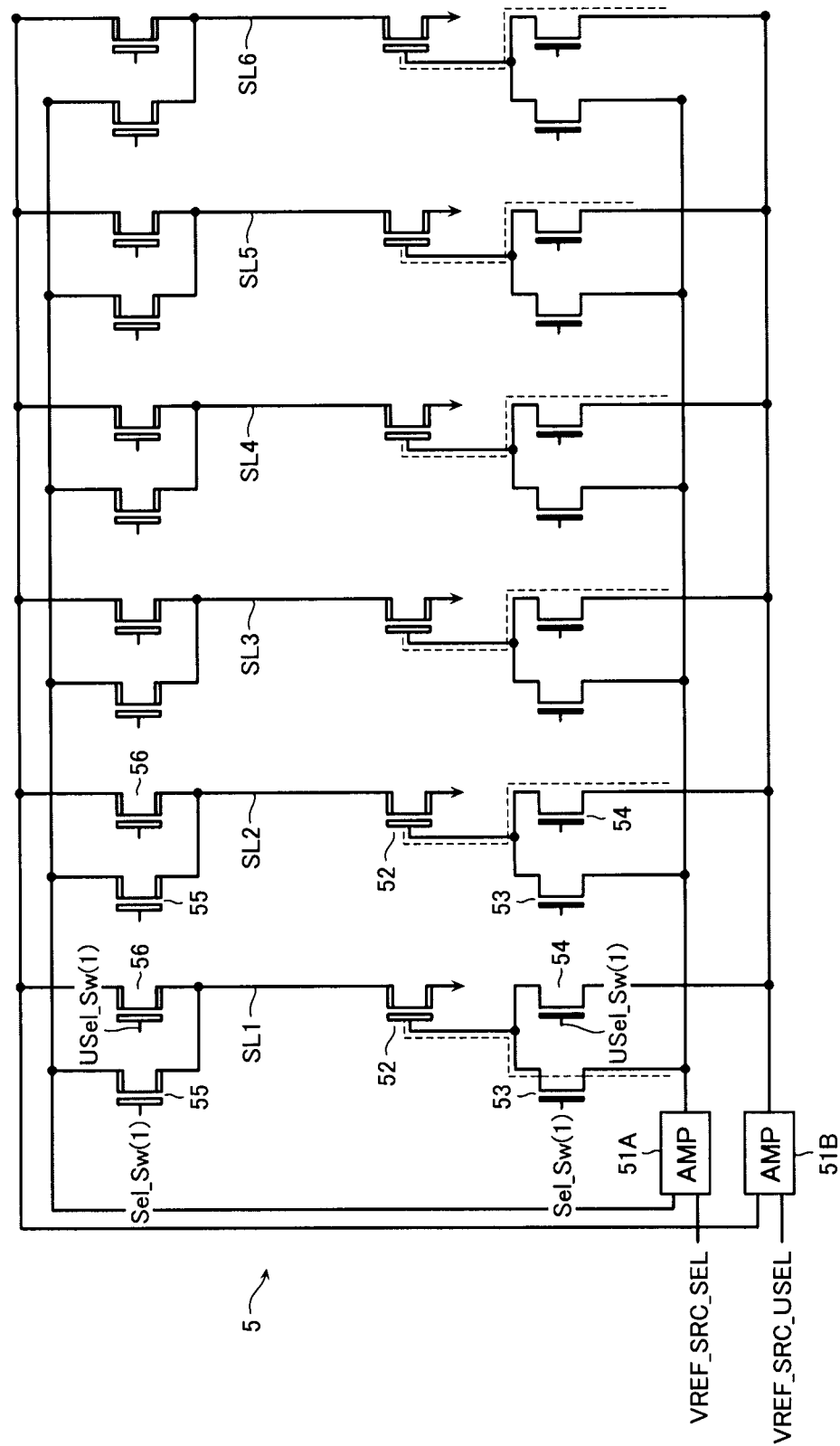
FIG. 9 is a circuit diagram of a specific example configuration of the source line driver 5 according to a second embodiment.

Referring now to FIG. 9, a non-volatile semiconductor memory device according to a second embodiment will be described. The second embodiment provides a different configuration of the source line driver 5 from the first embodiment. Other points in the second embodiment is similar to those in the first embodiment, and the repeated description thereof is omitted here.

With reference to FIG. 9, the source line driver 5 in this embodiment includes, for each source line SL, the high breakdown voltage NMOS transistor 52, the NMOS transistors 53 and 54, and high breakdown voltage NMOS transistors 55 and 56. The differential amplifiers 51A and 51B are shared by, for example, the 6 source lines SL1 to SL6. In other words, the differential amplifier 51A is provided for, among the 6 source lines SL1 to SL6, one source line SL connected to the selected memory string MSs. The differential amplifier 51B is provided for, among the 6 source lines SL1 to SL6, 5 source lines SL connected to the non-selected memory string MSns. Although this example gives a description of 6 source lines SL, the differential amplifiers 51A and 51B may be commonly connected to all source lines SL included in the memory cell array AR1.

The differential amplifier 51A differentially amplifies the voltage of the source line SL supplied from the NMOS transistor 55 and the reference voltage VREF_SRC_SEL. The differential amplifier 51B differentially amplifies the voltage of the source line SL supplied from the NMOS transistor 56 and the reference voltage VREF_SRC_USEL.

The output signal from the differential amplifier 51A is supplied to the gate of the NMOS transistor 52 via the NMOS transistor 53. The output signal from the differential amplifier 51B is supplied to the gate of the NMOS transistor 52 via the NMOS transistor 54.

The high breakdown voltage NMOS transistor 52 is supplied at its gate with the output signal from the differential amplifier 51A or 51B. The drain and the source of the transistor 52 are connected to the source line SL and the ground terminal, respectively.

The NMOS transistor 53 is connected between the output terminal of the differential amplifier 51A and the gate of the NMOS transistor 52. The NMOS transistor 54 is connected between the output terminal of the differential amplifier 51B and the gate of the NMOS transistor 52. Then, the NMOS transistors 53 and 54 are alternatively switched to the conductive state, according to the control signals Sel_Sw (i) and USel_Sw (i), depending on whether or not the memory string MS connected to the source line SL is selected (In the source line SLs connected to the selected memory string MSs, the NMOS transistor 53 is brought to the conductive state and the NMOS transistor 54 is brought to the non-conductive state. For the source line SLs connected to the non-selected memory string MSs, the NMOS transistor 54 is brought to the conductive state and the NMOS transistor 53 is brought to the non-conductive state).

The NMOS transistor 55 is connected between the input terminal of the differential amplifier 51A and the source line SL. The NMOS transistor 56 is connected between the input terminal of the differential amplifier 51B and the source line SL. Then, the NMOS transistors 55 and 56 are alternatively switched to the conductive state, depending on whether or not the memory string MS connected to the source line SL is selected (In the source line SL connected to the selected memory string MSs, the NMOS transistor 55 is brought to the conductive state and the NMOS transistor 56 is brought to the non-conductive state. For the source line SLs connected to the non-selected memory string MSs, the NMOS transistor 56 is brought to the conductive state and the NMOS transistor 55 is brought to the non-conductive state).

In the second embodiment, the source line driver 5 includes the NMOS transistors 55 and 56 as described above. The transistors 55 and 56 form feedback paths to the differential amplifier 51A or 51B. The differential amplifier 51B is shared by the 5 source lines SLns connected to the non-selected memory strings MSns, thereby allowing for a reduced number of differential amplifiers. As a result, the circuit area may be reduced.

Figure 10:
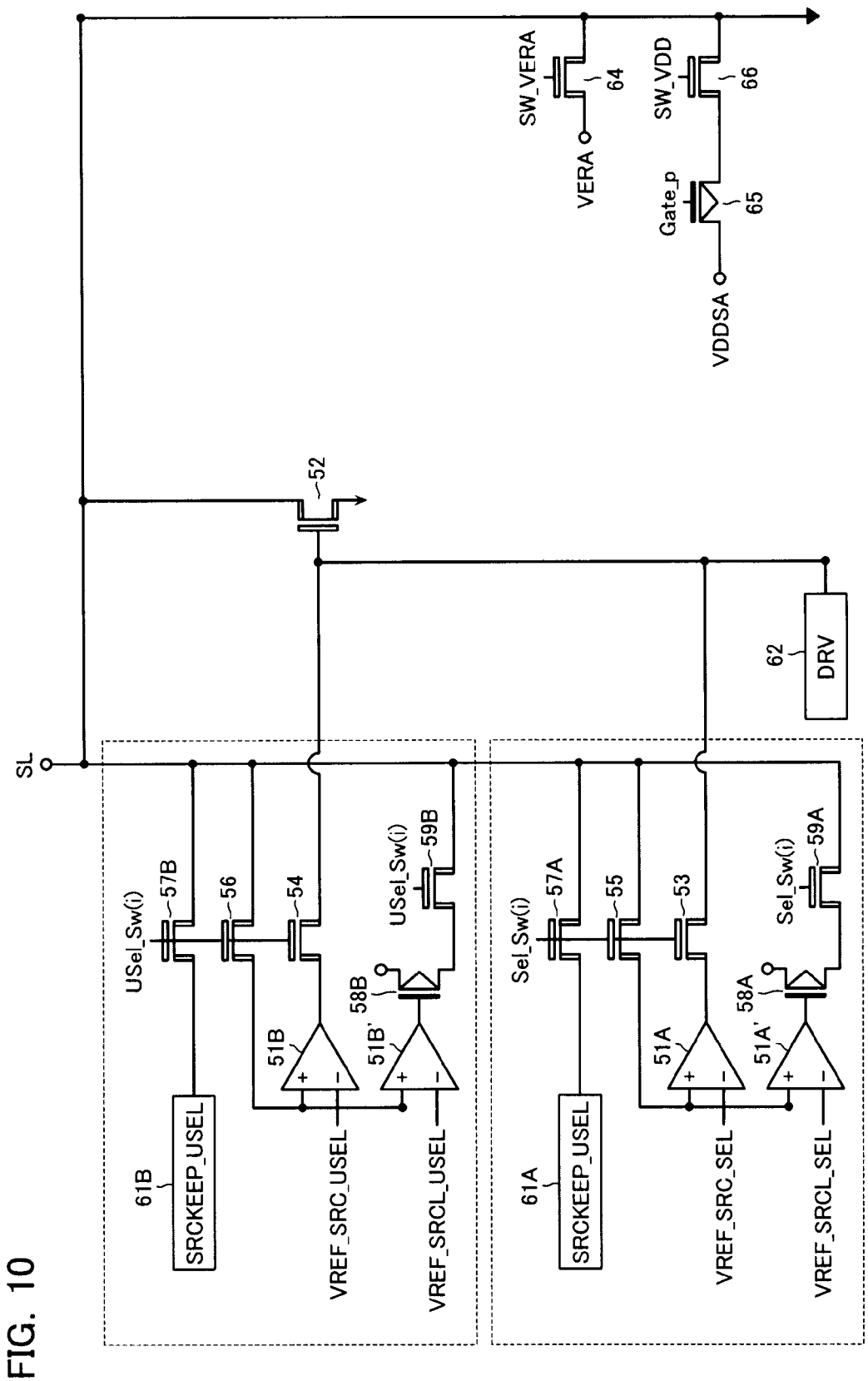
FIG. 10 is a circuit diagram of a more detailed example configuration of the source line driver 5 according to the second embodiment.

FIG. 10 illustrates the configuration of the source line driver 5 of this embodiment in more detail. In FIG. 10, like elements as those in the circuit diagram in FIG. 9 are designated by like symbols and their detailed description is omitted below.

The circuit in FIG. 10 includes, as a configuration for raising the voltage of the source line SL from, for example, 0 V to a certain potential (for example, VSL) when the source line SL is selected, a differential amplifier 51A', a high breakdown voltage PMOS transistor 58A, and a high breakdown voltage NMOS transistor 59A. The differential amplifier 51A' differentially amplifies the voltage of the source line SL supplied via the NMOS transistor 55 and the reference voltage VREF_SRCL_SEL. The differential amplifier 51A' supplies the output signal to the gate of the PMOS transistor 58A. The PMOS transistor 58A is supplied at its source with the power supply voltage Vdd. The drain of the PMOS transistor 58A is connected to the drain of the NMOS transistor 59A. The NMOS transistor 59A is switched to the conductive state by the control signal Sel_Sw (i) becoming "H."

The differential amplifier 51A' and the PMOS transistor 58A raise the potential of the source line SL to a predetermined potential (for example, VSL). Then, the capacitive coupling with the bit line BL and the like, for example, may raise the potential of the source line SL to the desired potential or higher. As a configuration to pull down the voltage that has become higher than a desired value to the desired value, the differential amplifier 51A is provided. The same holds true for the differential amplifier 51B.

The source line driver 5 in FIG. 10 includes, as a configuration for raising the voltage of the source line SL from, for example, 0 V to a certain potential (for example, VBL) when a certain source line SL is non-selected, a differential amplifier 51B', a high breakdown voltage PMOS transistor 58B, and a high breakdown voltage NMOS transistor 59B.

The differential amplifier 51B' differentially amplifies the voltage of the source line SL supplied via the NMOS transistor 56 and the reference voltage VREF_SRCL_USEL. The differential amplifier 51B' supplies the output signal to the gate of the PMOS transistor 58B. The NMOS transistor 59B is switched to the conductive state by the control signal USel_Sw (i)="H."

Further, the source line driver 5 in FIG. 10 includes as a configuration for maintaining the voltage of the source line SL at a predetermined potential (for example, VSL) when a certain source line SL is selected, a high breakdown voltage PMOS transistor 57A and a voltage generation circuit 61A. Further, the source line driver 5B in FIG. 10 includes, as a configuration for maintaining the voltage of the source line SL at a predetermined potential (for example, VBL) when a certain source line SL is non-selected, a high breakdown voltage PMOS transistor 57B and a voltage generation circuit 61B.

Further, the source line driver 5 in FIG. 10 includes a driver 62, a high breakdown voltage NMOS transistor 64, a high breakdown voltage PMOS transistor 65, and a high breakdown voltage NMOS transistor 66. The driver 62 drives the gate of the PMOS transistor 52 to the power supply voltage VDD or the ground voltage VSS. The driver 62 is used for setting the source line to 0 V, for example. The source of the PMOS transistor 64 is provided with the erase voltage VERA that is to be provided to the source line in the erase operation. The PMOS transistor 64 supplies, when the control signal SW_VERA provided to its gate becomes "H," the voltage necessary for the erase operation to the source line SL.

Further, the PMOS transistors 65 and the NMOS transistor 66 are connected in series between the power supply voltage terminal and the source line SL. The PMOS transistor 65 is provided at its source with the voltage VDDSA and is provided at its gate with the control signal Gate_p. Further, the NMOS transistor 66 is connected between the drain of the PMOS transistor 65 and the source line SL, and is switched to the conductive state according to the control signal SW_VDD="H."

[Third Embodiment]

Figure 11:
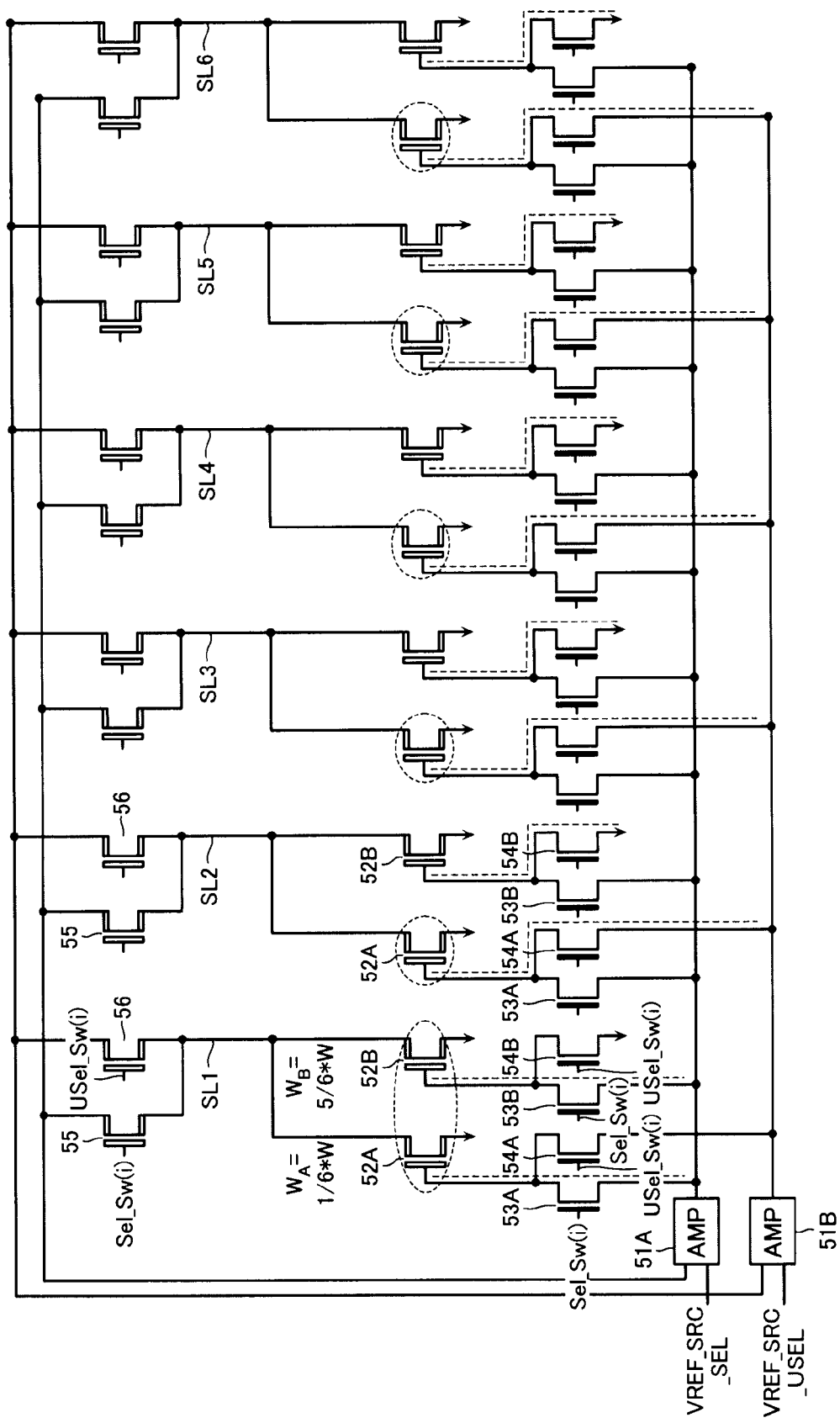
FIG. 11 is a circuit diagram of a specific example configuration of a non-volatile semiconductor memory device according to a third embodiment.

Referring now to FIG. 11, a non-volatile semiconductor memory device according to a third embodiment will be described. The third embodiment provides a different configuration of the source line driver 5 from the above embodiments. Other points in the second embodiment is similar to those in the first embodiment, and the repeated description thereof is omitted here.

With reference to FIG. 11, in this embodiment, the source line driver 5 includes, for each source line SL, high breakdown voltage NMOS transistors 52A and 52B, NMOS transistors 53A, 54A, 53B, and 54B, and high breakdown voltage NMOS transistors 55 and 56. The differential amplifiers 51A and 51B and the NMOS transistors 55 and 56 have similar configurations to the second embodiment.

In the third embodiment, the high breakdown voltage NMOS transistor 52 of the second embodiment is replaced with two high breakdown voltage NMOS transistors 52A and 52B connected in parallel between one source line SL and the ground terminal. The NMOS transistors 52A and 52B have different sizes. If, by way of example, the NMOS transistor 52 of the second embodiment has a gate width of W, the gate widths WA and WB of the NMOS transistors 52A and 52B may be set to WA=⅙ W and WB=⅚ W, respectively (W=WA+WB).

Between the output terminal of the differential amplifier 51A and the gate of the NMOS transistor 52A, the NMOS transistor 53A is connected. Between the output terminal of the differential amplifier 51B and the gate of the NMOS transistor 52A, the NMOS transistor 54A is connected. Further, between the output terminal of the differential amplifier 51A and the gate of the NMOS transistor 52B, the NMOS transistor 53B is connected. Additionally, between the gate of the NMOS transistor 52B and the ground terminal, the NMOS transistor 54B is connected. The gates of the NMOS transistors 53A and 53B are supplied with the above control signal Sel_Sw (i). The gates of the NMOS transistors 54A and 54B are supplied with the above control signal USel_Sw (i).

If, for example, a memory string connected to the source line SL1 is selected, the NMOS transistors 53A, 53B, and 55 corresponding to the source line SL1 are brought to the conductive state, and the NMOS transistors 54A, 54B, and 56 are brought to the non-conductive state. Therefore, the voltage of the source line SL1 is controlled by both NMOS transistors 52A and 52B having a total gate width of WA+WB=W.

For other source lines SL2 to SL6 connected to the non-selected memory strings, the NMOS transistors 53A, 53B, and 55 are brought to the non-conductive state, and the NMOS transistors 54A, 54B, and 56 are brought to the conductive state. Therefore, the source lines SL2 to SL6 are voltage controlled only by the NMOS transistor 52A having a gate width of ⅙ W. Therefore, according to this embodiment, compared to the above embodiments, the current consumption of the source lines SL2 to SL6 connected to the non-selected memory strings may be reduced, thereby reducing the power consumption as a whole.

Figure 12:
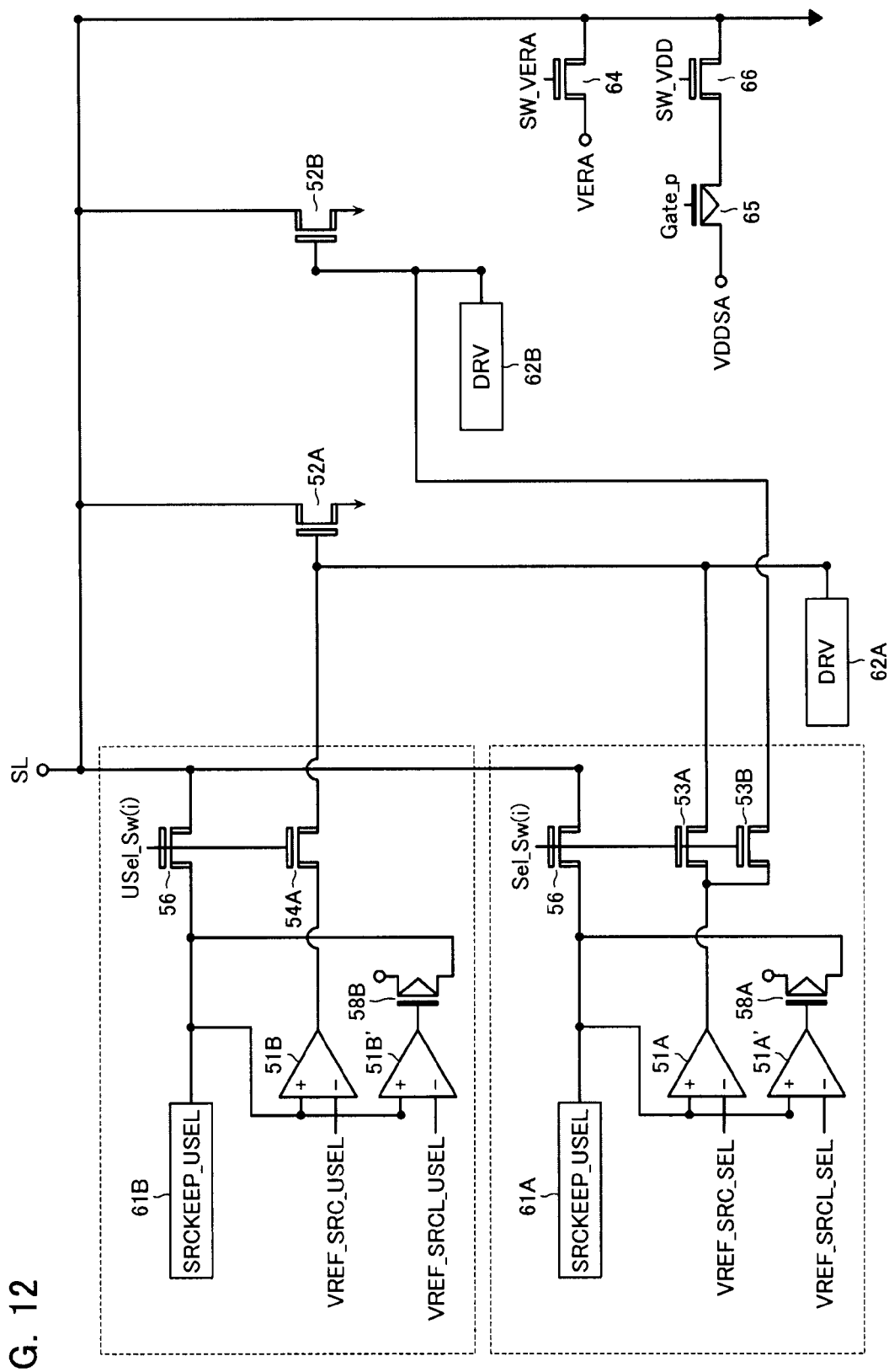
FIG. 12 is a circuit diagram of a more detailed example configuration of the source line driver 5 according to the third embodiment.

FIG. 12 illustrates the configuration of the source line driver 5 of this embodiment in more detail. In FIG. 12, like elements as those in the circuit diagram in FIG. 11 are designated by like symbols and their detailed description is omitted below. Also, like elements as those in FIG. 10 are designated by like symbols and their detailed description is omitted below.

The source line driver 5 in FIG. 12 includes, as a configuration for raising the voltage of the source line SL from, for example, 0 V to a certain potential when a certain source line SL is selected, the differential amplifier 51A' and the high breakdown voltage PMOS transistor 58A. The differential amplifier 51A' differentially amplifies the voltage of the source line SL supplied via the NMOS transistor 55 and the reference voltage VREF_SRCL_SEL. The differential amplifier 51A' supplies the output signal to the gate of the PMOS transistor 58A. The PMOS transistor 58A is provided at its source with a predetermined voltage. The drain of the PMOS transistor 58A is connected to the drain of the NMOS transistor 55.

Further, the source line driver 5 in FIG. 12 includes, as a configuration for raising the voltage of the source line SL from, for example, 0 V to a certain potential when a certain source line SL is non-selected, a differential amplifier 51B' and a high breakdown voltage PMOS transistor 58B. The differential amplifier 51B' differentially amplifies the voltage of the source line SL supplied via the NMOS transistor and the reference voltage VREF_SRCL_USEL. The differential amplifier 51B' supplies the output signal to the gate of the PMOS transistor 58B.

[Fourth Embodiment]

Figure 13:
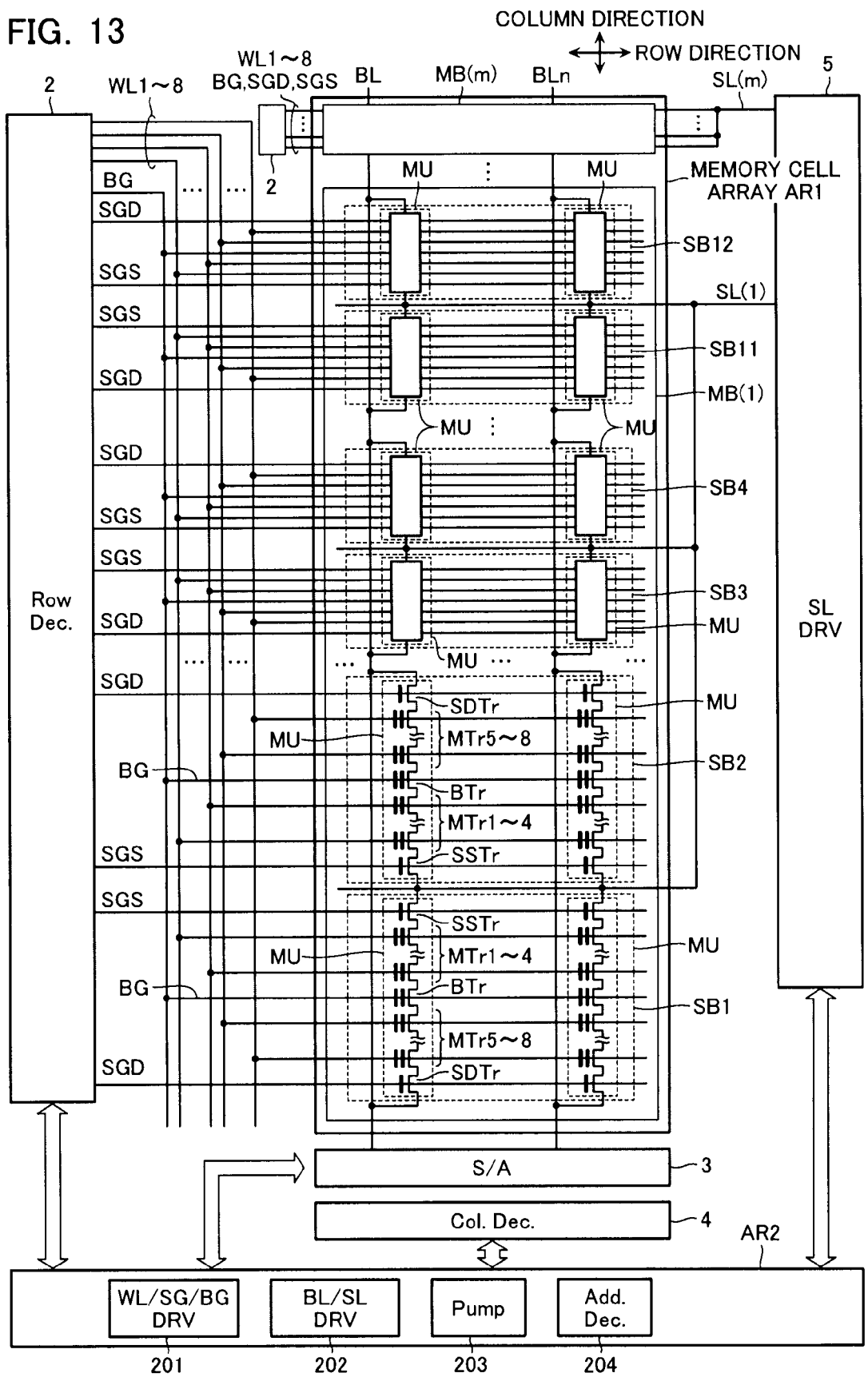
FIG. 13 is a circuit diagram of the entire configuration of a non-volatile semiconductor memory device according to a fourth embodiment.
Figure 14:
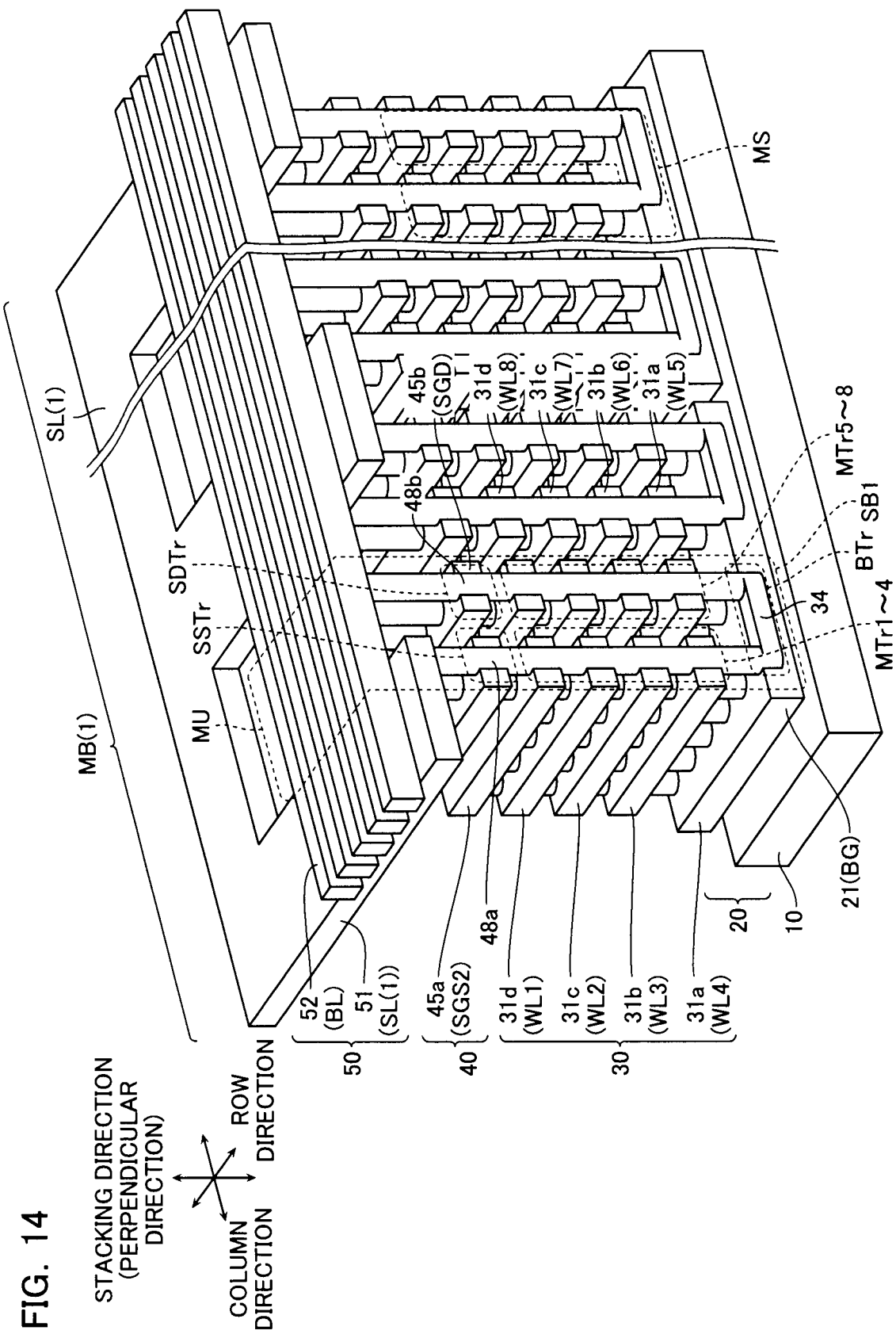
FIG. 14 is a schematic perspective view of the memory cell array AR1 in FIG. 13.
Figure 15:
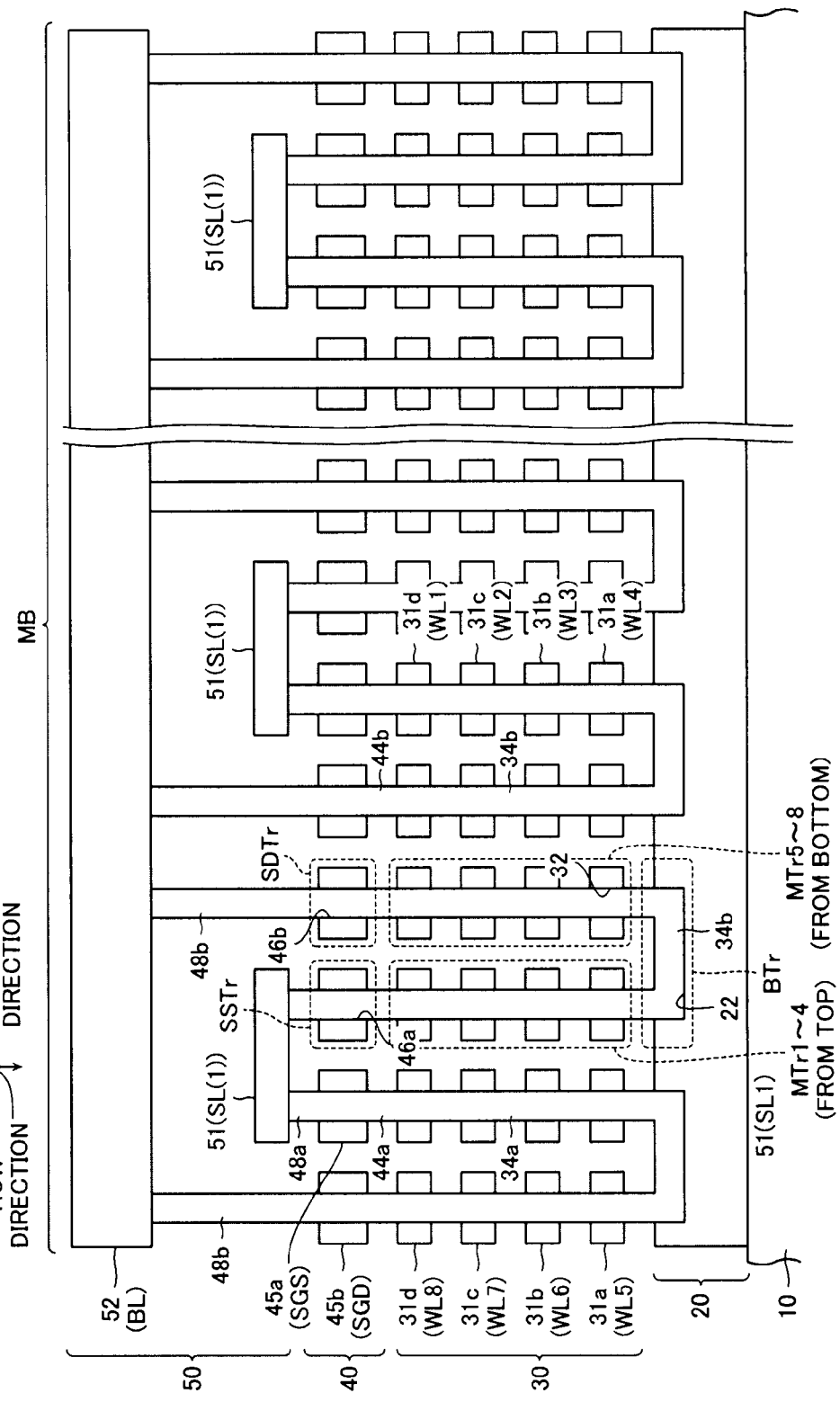
FIG. 15 is a schematic cross-sectional view of the memory block MB in the memory cell array AR1 in FIG. 13.

Referring now to FIG. 13 to FIG. 16C, a non-volatile semiconductor memory device according to a fourth embodiment will be described. FIG. 13 to FIG. 15 are a circuit diagram, a perspective view, and a cross-sectional view, respectively, of the configuration of a non-volatile semiconductor memory device according to the fourth embodiment. In FIG. 13, like elements as those in the first embodiment are designated by like symbols as those in FIG. 1, and their detailed description is omitted below. Further, the shapes of the memory strings MS and the word lines WL may be similar to those shown in FIG. 5 and FIG. 6.

With reference to FIG. 13, in the non-volatile semiconductor memory device according to the fourth embodiment, each of the memory blocks MB (1) to MB (m) include one of the source lines SL (1) to SL (m). The fourth embodiment is thus different from the above embodiments in which one memory block MB includes 6 independent source lines SL.

Figure 16A:
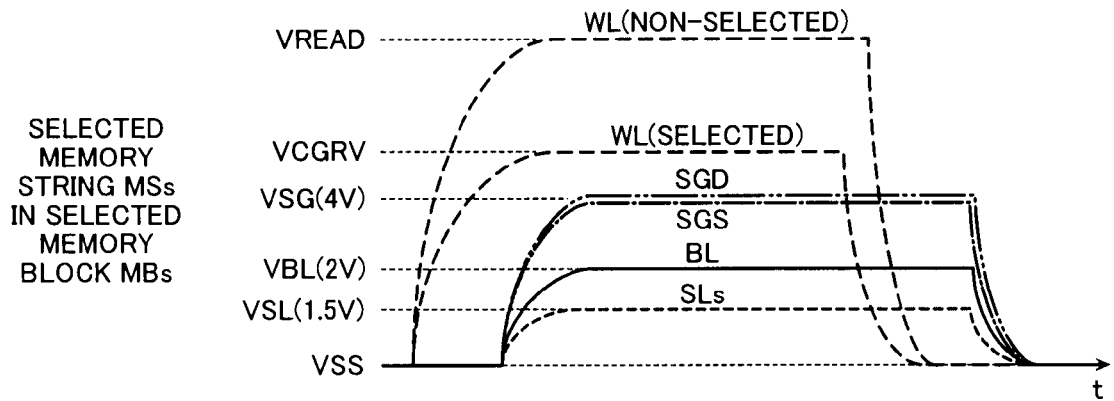
FIG. 16A is a waveform chart of the read operation in a non-volatile semiconductor memory device according to the fourth embodiment.
Figure 16B:
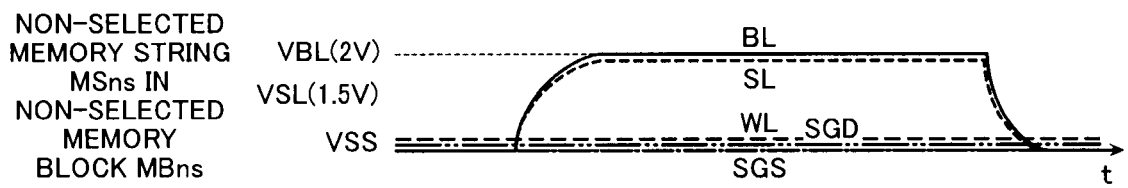
FIG. 16B is a waveform chart of the read operation in a non-volatile semiconductor memory device according to the fourth embodiment.
Figure 16C:
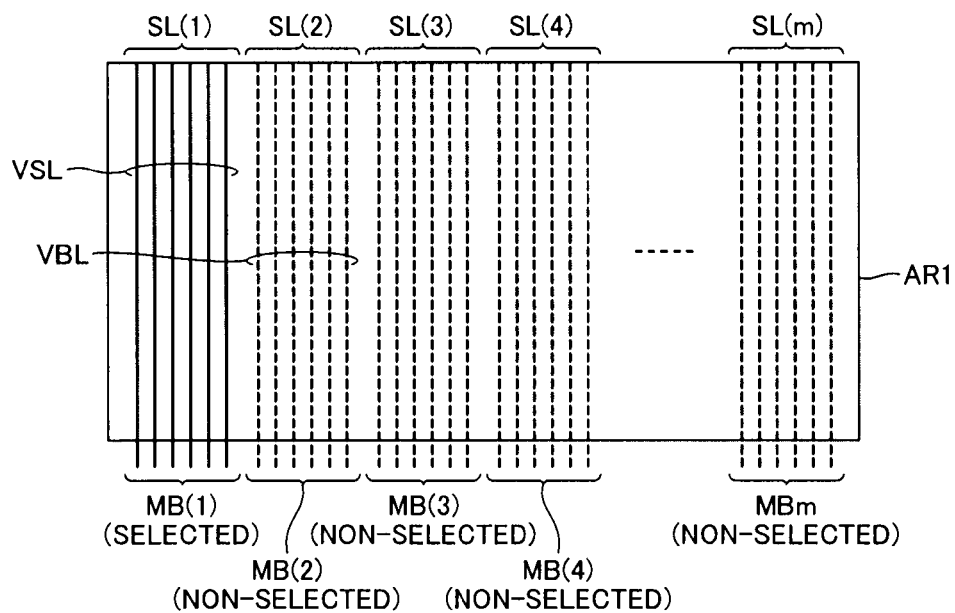
FIG. 16C is a schematic diagram of the read operation in a non-volatile semiconductor memory device according to the fourth embodiment.

Referring now to FIGS. 16A to 16C, the read operation of the non-volatile semiconductor memory device according to the fourth embodiment will be described. The difference between the fourth embodiment and the first embodiment will be described below.

With reference to FIG. 16A, the operations in the selected memory string MSs in the selected memory block MBs is generally the same as those in the first embodiment. Note, however, that, in this embodiment, all source lines SL in the selected memory block MBs are provided with the voltage VSL (1.5 V), and all source lines SL in the non-selected memory block MBns are provided with the voltage VBL (see FIG. 16C). This is different from the case that even in the selected memory block MBs, only the selected source line SLs connected to the selected memory string MSs is supplied with the voltage VSL, and other non-selected source lines SLns are supplied with the voltage VBL. Even for the above voltage application, among the 12×m memory strings MS connected to the selected bit line BL, the memory string MS whose source line SL is supplied with the voltage VSL has the same number as in the first embodiment. Therefore, effects similar to those in the first embodiment may be provided. Further, each block uses the common source line SL, thereby allowing for a reduced device area.

Further, the non-selected memory block MBns and the non-selected source line SLns may be linked in operations. As a result, the circuit operation may be simplified.

[Fifth Embodiment]

Figure 17:
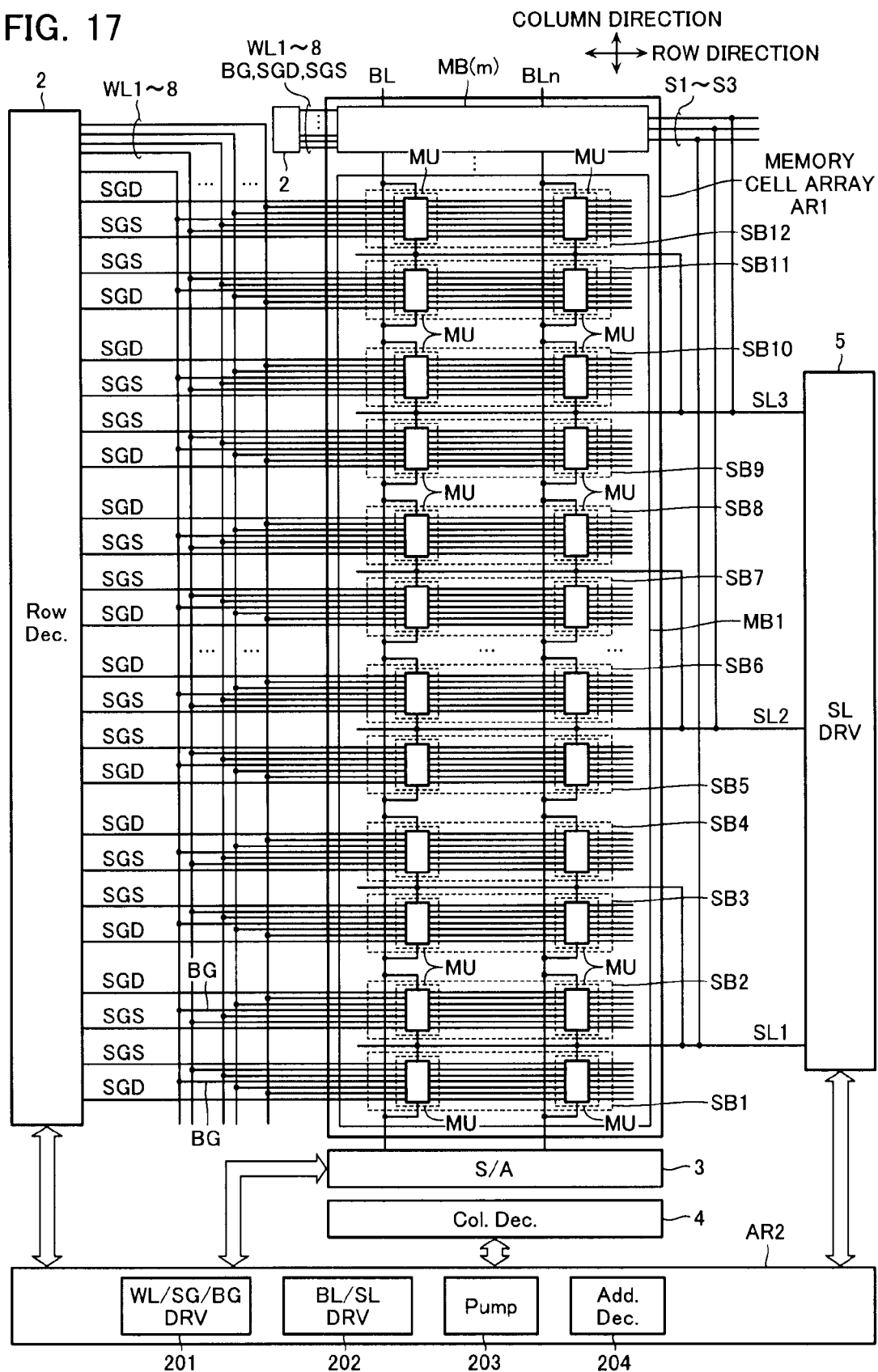
FIG. 17 is a circuit diagram of the entire configuration of a non-volatile semiconductor memory device according to a fifth embodiment.

Referring now to FIG. 17, a non-volatile semiconductor memory device according to a fifth embodiment will be described. FIG. 17 is a circuit diagram of the configuration of a non-volatile semiconductor memory device according to the fifth embodiment. In FIG. 17, like elements as those in the first embodiment are designated by like symbols as those in FIG. 1, and their detailed description is omitted below. Further, the shapes of the memory strings MS and the word lines WL may be similar to those shown in FIG. 5 and FIG. 6.

With reference to FIG. 17, in the non-volatile semiconductor memory device according to the fifth embodiment, among the 12 sub-blocks SB1 to SB12 in one memory block MB, the four adjacent sub-blocks SB share one source line SL. Specifically, one memory block MB includes 3 independent source lines SL1 to SL3. The number of source lines SL1 to SL3 is one-fourth of the number (12) of sub-blocks SB. The fifth embodiment is thus different from the first embodiment in which one memory block MB includes 6 independent source lines SL.

FIG. 18A to 18D illustrate the operations of the non-volatile semiconductor memory device according to the fifth embodiment. The operations in the fifth embodiment are generally the same as those in the first embodiment (FIG. 7), and their detailed description is omitted here.

Figure 18A:
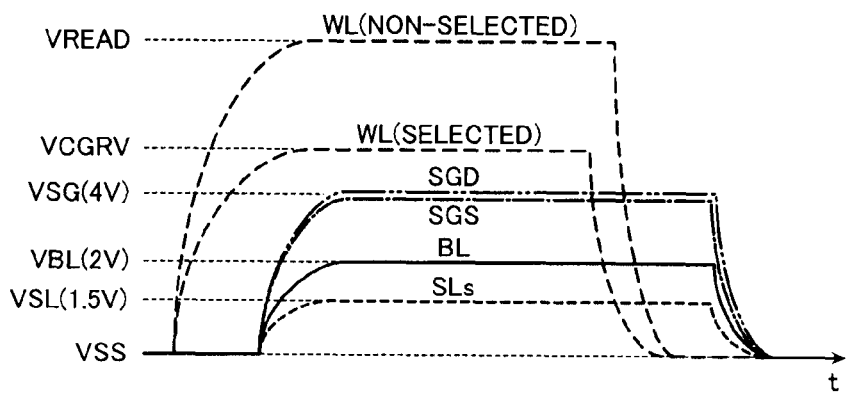
FIG. 18A is a waveform chart of the read operation in a non-volatile semiconductor memory device according to the fifth embodiment.
Figure 18B:
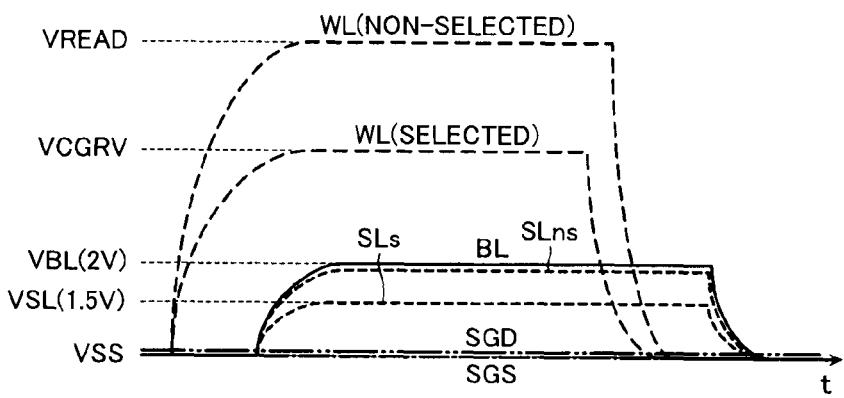
FIG. 18B is a waveform chart of the read operation in a non-volatile semiconductor memory device according to the fifth embodiment.
Figure 18C:
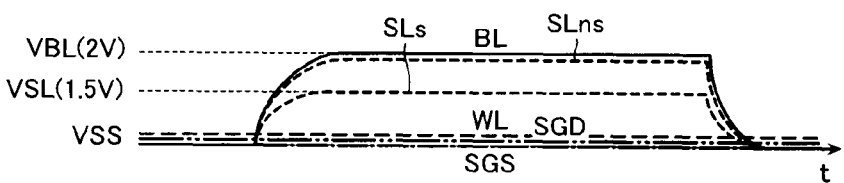
FIG. 18C is a waveform chart of the read operation in a non-volatile semiconductor memory device according to the fifth embodiment.
Figure 18D:
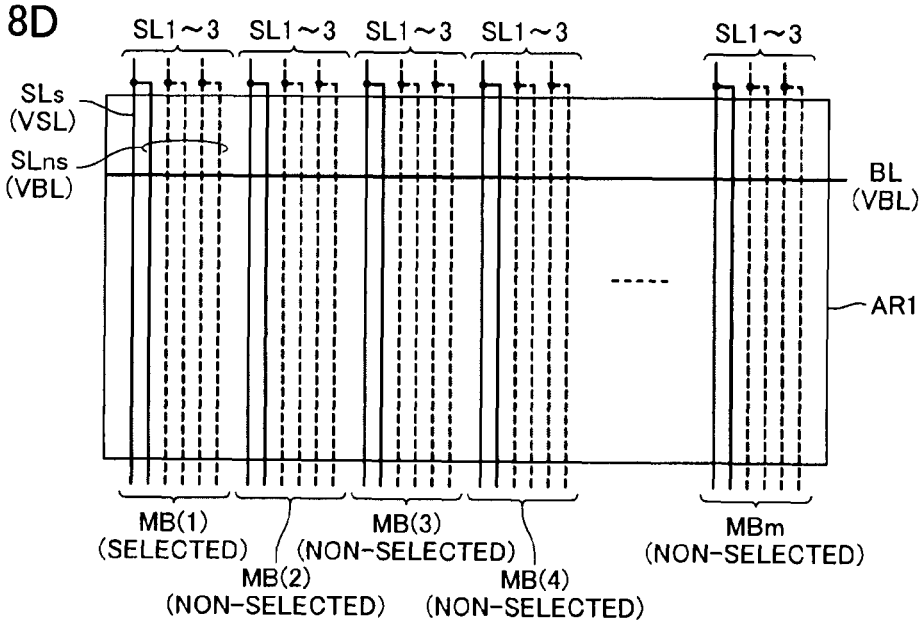
FIG. 18D is a schematic diagram of the read operation in a non-volatile semiconductor memory device according to the fifth embodiment.

With reference to FIG. 18D, three or more sub-blocks SB sharing the source line SL may decrease the number of sources SL that are to be independently controlled. This may achieve a lower leak current, a simpler circuit operation, and an even larger storage capacity.

While certain embodiments of the inventions have been described, these embodiments have been presented by way of example only, and are not intended to limit the scope of the inventions. Indeed, the novel methods and systems described here in may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions. Although, for example, the above embodiments have been described with respect to a memory string MS having a U shaped cross-section, it will be appreciated that the present invention is applicable to a non-volatile semiconductor memory device having a memory string MS of an I shaped (straight) cross-section.

What is claimed is:

1. A non-volatile semiconductor memory device comprising:
   a memory cell array comprising a plurality of memory blocks;
   a plurality of memory strings formed in each of the memory blocks, each memory string including a plurality of memory transistors connected in series, the plurality of memory transistors stacked in a direction perpendicular to a semiconductor substrate;
   a drain-side select transistor having a first end connected to a first end portion of each of the memory strings;
   a source-side select transistor having a first end connected to a second end portion of each of the memory strings;
   a plurality of word lines, each word line being commonly connected to the memory strings disposed in each of the memory blocks;
   a plurality of bit lines, each bit line being connected to second ends of the drain-side select transistors in respective memory blocks;
   a plurality of source lines provided in each of the memory blocks, each of the source lines being connected to a second end of the source-side select transistor;
   a drain-side select gate line provided to commonly connect gates of the drain-side select transistors;
   a source-side select gate line provided to commonly connect gates of the source-side select transistors; and
   a control circuit configured to control voltages supplied to the memory blocks,
   in performing a read operation of the memory transistor, the control circuit being configured to perform:
   supplying a first voltage to a selected word line connected to a selected memory transistor;
   supplying a second voltage to a non-selected word line connected to a non-selected memory transistor other than the selected memory transistor, the second voltage being higher than the first voltage;
   supplying a third voltage to the bit line;
   supplying a fourth voltage lower than the third voltage to, among the source lines, a selected source line connected to a memory string including the selected memory transistor in a selected memory block; and
   supplying a fifth voltage substantially the same as the third voltage to, among the source lines, a non-selected source line connected to a non-selected memory string in the selected memory block.

2. The non-volatile semiconductor memory device according to claim 1, wherein
   the control circuit supplies the fifth voltage to the source lines in a non-selected memory block other than the selected memory block.

3. The non-volatile semiconductor memory device according to claim 2, wherein
   the control circuit comprises:
   a first differential amplifier operative to differentially amplify a first reference potential and the potential of the source line and output a first output signal;
   a second differential amplifier operative to differentially amplify a second reference potential and the potential of the source line and output a second output signal; and
   a first transistor having a first end connected to the source line, the first transistor being provided with the first output signal or the second output signal at its gate.

4. The non-volatile semiconductor memory device according to claim 3, wherein the control circuit comprises:
a second transistor connected between the source line and an input terminal of the first differential amplifier, the second transistor being switched between a conductive state and a non-conductive state according to a first control signal; and
a third transistor connected between the source line and an input terminal of the second differential amplifier, the third transistor being switched between a conductive state and a non-conductive state according to a second control signal.

5. The non-volatile semiconductor memory device according to claim 1, wherein
the control circuit supplies a sixth voltage to gates of the drain-side select transistor and the source-side select transistor connected to the memory string including the selected memory transistor, and supplies a seventh voltage lower than the sixth voltage to gates of the drain-side select transistor and the source-side select transistor connected to the non-selected memory string.

6. The non-volatile semiconductor memory device according to claim 2, wherein
the control circuit comprises:
a first differential amplifier operative to differentially amplify a first reference potential and the potential of the source line and output a first output signal;
a second differential amplifier operative to differentially amplify a second reference potential and the potential of the source line and output a second output signal;
a first transistor having a first end connected to the source line, the first transistor being provided with the first output signal or the second output signal at its gate; and
a second transistor having a first end connected to the source line, the second transistor being provided with the first output signal or a fixed reference voltage at its gate.

7. The non-volatile semiconductor memory device according to claim 1, wherein
the control circuit comprises:
a first differential amplifier operative to differentially amplify a first reference potential and the potential of the source line and output a first output signal;
a second differential amplifier operative to differentially amplify a second reference potential and the potential of the source line and output a second output signal; and
a first transistor having a first end connected to the source line, the first transistor being provided with the first output signal or the second output signal at its gate.

8. The non-volatile semiconductor memory device according to claim 7, wherein
the control circuit comprises:
a second transistor connected between the source line and an input terminal of the first differential amplifier, the second transistor being switched between a conductive state and a non-conductive state according to a first control signal; and
a third transistor connected between the source line and an input terminal of the second differential amplifier, the third transistor being switched between a conductive state and a non-conductive state according to a second control signal.

9. The non-volatile semiconductor memory device according to claim 7, wherein
the first differential amplifier and the second differential amplifier are shared by the source lines in each of the memory blocks.

10. The non-volatile semiconductor memory device according to claim 1, wherein
the control circuit comprises:
a first differential amplifier operative to differentially amplify a first reference potential and the potential of the source line and output a first output signal;
a second differential amplifier operative to differentially amplify a second reference potential and the potential of the source line and output a second output signal;
a first transistor having a first end connected to the source line, the first transistor being provided with the first output signal or the second output signal at its gate; and
a second transistor a first end connected to the source line, the second transistor being provided with the first output signal or a fixed reference voltage at its gate.

11. The non-volatile semiconductor memory device according to claim 10, wherein
the control circuit comprises:
the second transistor connected between the source line and an input terminal of the first differential amplifier, the second transistor being switched between a conductive state and a non-conductive state according to a first control signal; and
a third transistor connected between the source line and an input terminal of the second differential amplifier, the third transistor being switched between a conductive state and a non-conductive state according to a second control signal.

12. The non-volatile semiconductor memory device according to claim 1, wherein
each of the memory blocks comprises a plurality of sub-blocks,
each of the sub-blocks comprises a plurality of memory strings arranged along the drain-side select gate line and the source-side select gate line, and
each of the source lines is shared by two sub-blocks adjacent to each other.

13. The non-volatile semiconductor memory device according to claim 1, wherein
the source lines extend in a second direction intersecting with a first direction in which the plurality of bit lines extend and are commonly connected to the memory strings arranged in the second direction.

14. The non-volatile semiconductor memory device according to claim 13, wherein
one of the source lines is commonly connected to the memory strings adjacent in the first direction.

15. A non-volatile semiconductor memory device comprising:
a memory cell array comprising a plurality of memory blocks;
a plurality of memory strings formed in each of the memory blocks, each memory string including a plurality of memory transistors connected in series, the plurality of memory transistors stacked in a direction perpendicular to a semiconductor substrate;
a drain-side select transistor having a first end connected to a first end portion of each of the memory strings;
a source-side select transistor having a first end connected to a second end portion of each of the memory strings;
a plurality of word lines, each word line being commonly connected to the memory strings disposed in each of the memory blocks;
a plurality of bit lines, each bit line being connected to second ends of the drain-side select transistors in respective memory blocks;

a plurality of source lines each connected to a second end of the source-side select transistor, each of the source lines being provided for one of the memory blocks;

a drain-side select gate line provided to commonly connect the gates of the drain-side select transistors;

a source-side select gate line provided to commonly connect gates of the source-side select transistors; and a control circuit configured to control voltages supplied to the memory blocks, in performing a read operation of the memory transistor, the control circuit being configured to perform:

supplying a first voltage to a selected word line connected to a selected memory transistor;

supplying a second voltage to a non-selected word line connected to a non-selected memory transistor other than the selected memory transistor, the second voltage being higher than the first voltage;

supplying a third voltage to the bit line;

supplying a fourth voltage lower than the third voltage to, among the source lines, a source line connected to a selected memory block including the selected memory transistor; and supplying a fifth voltage substantially the same as the third voltage to, among the source lines, a source line connected to a non-selected memory block other than the selected memory block.

16. The non-volatile semiconductor memory device according to claim 15, wherein
the control circuit supplies the fifth voltage to the source lines in a non-selected memory block other than the selected memory block.

17. The non-volatile semiconductor memory device according to claim 15, wherein
the control circuit supplies a sixth voltage to gates of the drain-side select transistor and the source-side select transistor connected to the memory string including the selected memory transistor
, and supplies a seventh voltage lower than the sixth voltage to gates of the drain-side select transistor and the source-side select transistor connected to the non-selected memory string.

18. A method of controlling a non-volatile semiconductor memory device in a read operation thereof, the non-volatile semiconductor memory device comprising:
a memory cell array comprising a plurality of memory blocks;
a plurality of memory strings formed in each of the memory blocks, each of the memory strings including a plurality of memory transistors connected in series, the plurality of memory transistors stacked in a direction perpendicular to a semiconductor substrate;
a drain-side select transistor having a first end connected to a first end portions of each of the memory strings;
a source-side select transistor having a first end connected to a second end portions of each of the memory strings;
a plurality of word lines, each word line being commonly connected to the memory strings disposed in each of the memory blocks;
a plurality of bit lines extending, each bit lines being connected to second ends of the drain-side select transistors present in respective memory blocks;
a plurality of source lines provided in each of the memory blocks, each of the source lines being connected to a second end of the source-side select transistor;
a drain-side select gate line being provided to commonly connect gates of the drain-side select transistors;
a source-side select gate line being provided to commonly connect gates of the source-side select transistors; and
a control circuit configured to control voltages supplied to the memory blocks,
in the read operation, the method comprising:
supplying a first voltage to a selected word line connected to a selected memory transistor;
supplying a second voltage to a non-selected word line connected to a non-selected memory transistor other than the selected memory transistor, the second voltage being higher than the first voltage;
supplying a third voltage to the bit line;
supplying a fourth voltage lower than the third voltage to, among the source lines, a selected source line connected to a memory string including the selected memory transistor in a selected memory block; and
supplying a fifth voltage substantially the same as the third voltage to, among the source lines, a non-selected source line connected to a non-selected memory string in the selected memory block.

19. The method according to claim 18, further comprising supplying the fifth voltage to the source lines in a non-selected memory block other than the selected memory block.

20. The method according to claim 18, further comprising:
supplying a sixth voltage to gates of the drain-side select transistor and the source-side select transistor connected to the memory string including the selected memory transistor to render the drain-side select transistor and the source-side select transistor conductive; and
supplying a seventh voltage lower than the sixth voltage to gates of the drain-side select transistor and the source-side select transistor connected to the non-selected memory string to maintain the drain-side select transistor and the source-side select transistor in a non-conductive state.

* * * * *